(12) United States Patent
Yamamoto et al.

(10) Patent No.: US 9,791,854 B2
(45) Date of Patent: Oct. 17, 2017

(54) CORRECTION VALUE COMPUTATION DEVICE, CORRECTION VALUE COMPUTATION METHOD, AND COMPUTER PROGRAM

(71) Applicant: TOKYO ELECTRON LIMITED, Minato-ku (JP)

(72) Inventors: Takuo Yamamoto, Sapporo (JP); Yuki Kataoka, Sapporo (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 363 days.

(21) Appl. No.: 14/695,202

(22) Filed: Apr. 24, 2015

(65) Prior Publication Data
US 2015/0227139 A1 Aug. 13, 2015

Related U.S. Application Data

(63) Continuation of application No. PCT/JP2013/078552, filed on Oct. 22, 2013.

(30) Foreign Application Priority Data

Oct. 24, 2012 (JP) ................................. 2012-234817

(51) Int. Cl.
*G05B 19/418* (2006.01)
*G05B 13/04* (2006.01)
(Continued)

(52) U.S. Cl.
CPC ........ *G05B 19/41875* (2013.01); *C23C 16/52* (2013.01); *F02D 41/1402* (2013.01);
(Continued)

(58) Field of Classification Search
CPC ............. F02D 41/1402; F02D 41/1441; F02D 2041/141; F02D 2041/1412;
(Continued)

(56) References Cited

U.S. PATENT DOCUMENTS

| 6,497,214 B2 * | 12/2002 | Yagi ...................... F02D 11/105 |
| | | 123/399 |
| 6,535,795 B1 * | 3/2003 | Schroeder ............ G05B 13/029 |
| | | 210/143 |

(Continued)

FOREIGN PATENT DOCUMENTS

| JP | 2003-109906 A | 4/2003 | |
| JP | WO 2014065269 A1 * | 5/2014 | ............. C23C 16/52 |
| JP | KR 20150073975 A * | 7/2015 | ............. C23C 16/52 |

*Primary Examiner* — Crystal J Barnes-Bullock
(74) *Attorney, Agent, or Firm* — Oblon, McClelland, Maier & Neustadt, L.L.P.

(57) ABSTRACT

A device for computing correction for control parameter in a manufacturing process executed on a manufacturing apparatus includes circuitry which acquires an index representing fluctuation in a manufacturing apparatus, acquires an apparatus model and a process model, acquires an output from a sensor in the manufacturing apparatus, transforms the output into first fluctuation for a process element, transforms the index into second fluctuation for the process element based on the apparatus model, computes fluctuation for performance indicator from the first and second fluctuation based on the process model, computes correction for the performance indicator from control range for the performance indicator and the fluctuation for the performance indicator, and converts the correction for the performance indicator into correction for each process element based on the process model such that correction for control parameter in process executed on the manufacturing apparatus is computed from the correction converted for each process element.

20 Claims, 27 Drawing Sheets

(51) Int. Cl.
*G06N 5/02* (2006.01)
*F02D 41/14* (2006.01)
*C23C 16/52* (2006.01)
*F02D 41/20* (2006.01)
*H01L 21/66* (2006.01)

(52) U.S. Cl.
CPC ....... F02D 41/1441 (2013.01); G05B 13/041 (2013.01); G05B 13/042 (2013.01); G06N 5/022 (2013.01); *F02D 2041/1412* (2013.01); *F02D 2041/1416* (2013.01); *F02D 2041/1426* (2013.01); *F02D 2041/1433* (2013.01); *F02D 2041/2058* (2013.01); *F02D 2200/0402* (2013.01); *G05B 2219/31103* (2013.01); *G05B 2219/32018* (2013.01); *G05B 2219/32187* (2013.01); *H01L 22/20* (2013.01); *H01L 2924/0002* (2013.01); *Y02P 90/12* (2015.11); *Y02P 90/22* (2015.11)

(58) Field of Classification Search
CPC ..... F02D 2041/1416; F02D 2041/1426; F02D 2041/1433; F02D 2041/2058; F02D 2200/0402; G05B 13/029; G05B 13/042; G05B 19/41875; G05B 2219/31103; G05B 2219/32018; G05B 2219/32187; G06N 5/022
See application file for complete search history.

(56) References Cited

U.S. PATENT DOCUMENTS

| | | | | |
|---|---|---|---|---|
| 6,952,688 | B1* | 10/2005 | Goldman | G06N 5/022 706/45 |
| 7,123,850 | B1* | 10/2006 | Hamby | G03G 15/5037 399/46 |
| 7,158,840 | B2* | 1/2007 | Jacques | G05B 13/042 700/28 |
| 7,386,354 | B2* | 6/2008 | Yasui | G05B 5/01 700/266 |
| 8,140,174 | B2* | 3/2012 | Yasui | F02D 41/1406 700/31 |
| 2007/0193687 | A1* | 8/2007 | Kagoshima | G05B 19/41875 156/345.25 |
| 2010/0250187 | A1* | 9/2010 | Zuber | G06F 17/5036 702/179 |
| 2010/0268353 | A1* | 10/2010 | Crisalle | G05B 13/048 700/29 |
| 2012/0221227 | A1* | 8/2012 | Alfieri | F02D 35/023 701/104 |
| 2013/0133751 | A1* | 5/2013 | Backi | F01K 13/00 137/11 |

* cited by examiner

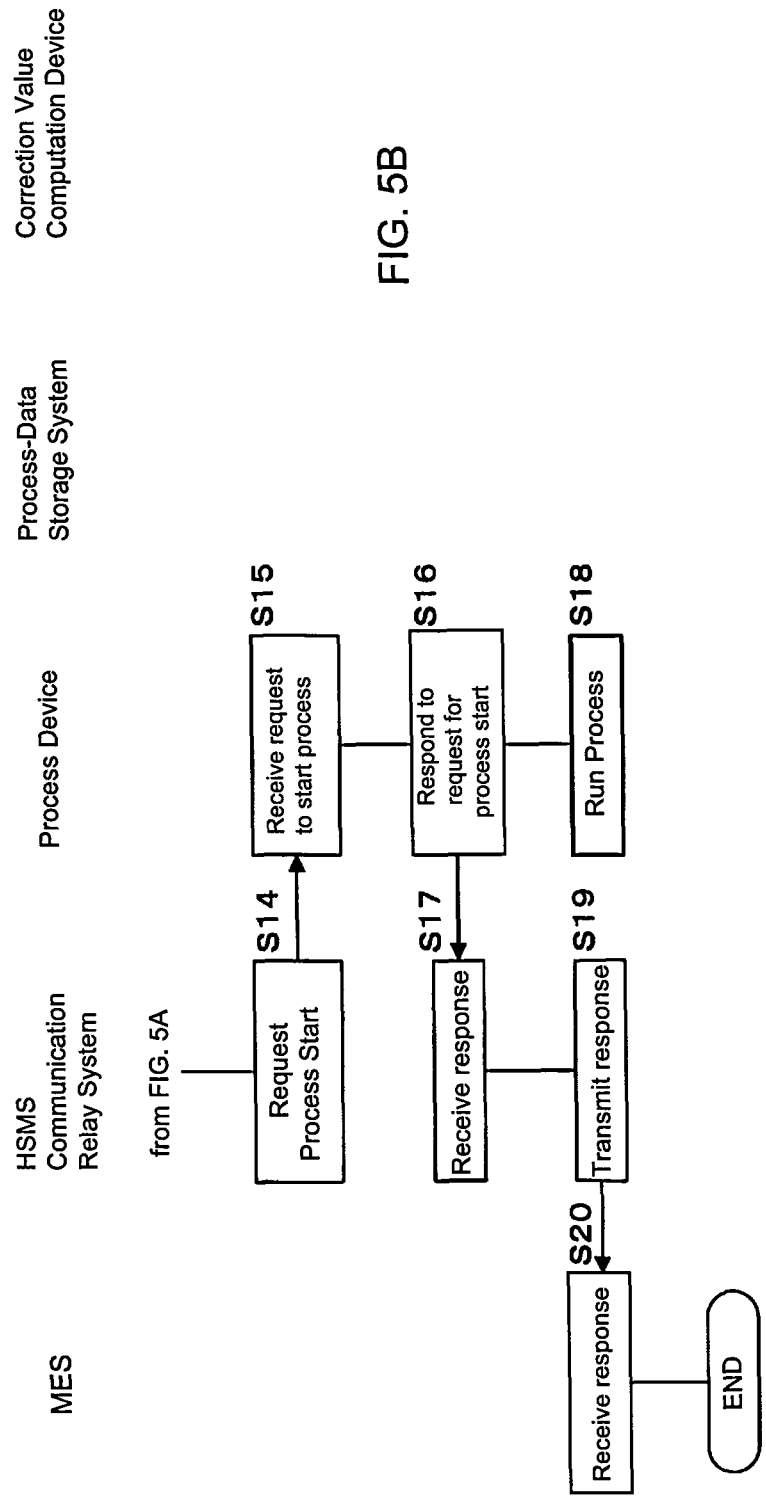

CORRECTION VALUE COMPUTATION DEVICE, CORRECTION VALUE COMPUTATION METHOD, AND COMPUTER PROGRAM

CROSS-REFERENCE TO RELATED APPLICATIONS

The present application is continuation of and claims the benefit of priority to International Application No. PCT/JP2013/078552, filed Oct. 22, 2013, which is based upon and claims the benefit of priority to Japanese Patent Application No. 2012-234817, filed Oct. 24, 2012. The entire contents of these applications are incorporated herein by reference.

BACKGROUND OF THE INVENTION

Field of the Invention

The present invention relates to a correction value computation device, a correction value computation method, and a computer program that compute a correction value for a control parameter supplied to a manufacturing apparatus.

Description of Background Art

Japanese Unexamined Patent Application Publication No. 2003-109906 describes a semiconductor manufacturing apparatus that controls a temperature in accordance with a relationship between an accumulated film thickness and the temperature required for generating a film to improve the uniformity of the film between batches. The entire contents of the publication are incorporated herein by reference.

SUMMARY OF THE INVENTION

According to one aspect of the present invention, a correction value computation device for computing a correction value for a control parameter in a manufacturing process executed on a manufacturing apparatus includes circuitry which acquires an index value representing a fluctuation phenomenon in a manufacturing apparatus, acquires an apparatus model representing a relationship between the index value and a process element of an environment in which a manufacturing process is executed, acquire a process model representing a relationship between a performance indicator rating results of executing the manufacturing process and the process element, acquires an output value output from a sensor provided in the manufacturing apparatus, transforms the output value into a first fluctuation amount for the process element, transforms the index value into a second fluctuation amount for the process element based on the apparatus model, computes a fluctuation amount for the performance indicator from the first and second fluctuation amounts for the process element based on the process model, computes a correction amount for the performance indicator from a control range for the performance indicator and the fluctuation amount for the performance indicator, and converts the correction amount for the performance indicator into a correction amount for each process element based on the process model such that a correction value for a control parameter in a process executed on the manufacturing apparatus is computed from the correction amount converted for each process element.

According to another aspect of the present invention, a method for computing a correction value for a control parameter in a manufacturing process executed on a manufacturing apparatus includes acquiring an apparatus model representing a relationship between an index value of a fluctuation phenomenon in a manufacturing apparatus and a fluctuation amount in a process element of an environment in which a manufacturing process is executed, acquiring a process model representing a relationship between a performance indicator rating results of executing the manufacturing process and the process element, acquiring an output value output from a sensor provided in the manufacturing apparatus, transforming the output value acquired from the sensor into a first fluctuation amount for the process element, acquiring the index value of the fluctuation phenomenon in the manufacturing apparatus, transforming the index value into a second fluctuation amount for the process element based on the apparatus model, computing a fluctuation amount for the performance indicator from the first and second fluctuation amounts for the process element based on the process model, computing a correction amount for the performance indicator from a control range for the performance indicator and the fluctuation amount computed for the performance indicator, and converting the correction amount computed for the performance indicator into a correction amount for each process element based on the process model such that a correction value for a control parameter in the manufacturing process executed on the manufacturing apparatus is computed from the correction amount converted for each process element.

According to yet another aspect of the present invention, a non-transitory computer readable medium stored thereon a program that when executed by a computer causes the computer having circuitry to execute a method for computing a correction value for a control parameter in a manufacturing process executed on a manufacturing apparatus. The method includes acquiring an apparatus model representing a relationship between an index value of a fluctuation phenomenon in a manufacturing apparatus and a fluctuation amount in a process element of an environment in which a manufacturing process is executed, acquiring a process model representing a relationship between a performance indicator rating results of executing the manufacturing process and the process element, acquiring an output value output from a sensor provided in the manufacturing apparatus, transforming the output value acquired from the sensor into a first fluctuation amount for the process element, acquiring the index value of the fluctuation phenomenon in the manufacturing apparatus, transforming the index value into a second fluctuation amount for the process element based on the apparatus model, computing a fluctuation amount for the performance indicator from the first and second fluctuation amounts for the process element based on the process model, computing a correction amount for the performance indicator from a control range for the performance indicator and the fluctuation amount computed for the performance indicator, and converting the correction amount computed for the performance indicator into a correction amount for each process element based on the process model such that a correction value for a control parameter in the manufacturing process executed on the manufacturing apparatus is computed from the correction amount converted for each process element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5B is a sequence chart illustrating an example of operations in the online correction system;

DETAILED DESCRIPTION OF THE EMBODIMENTS

Figure 1:
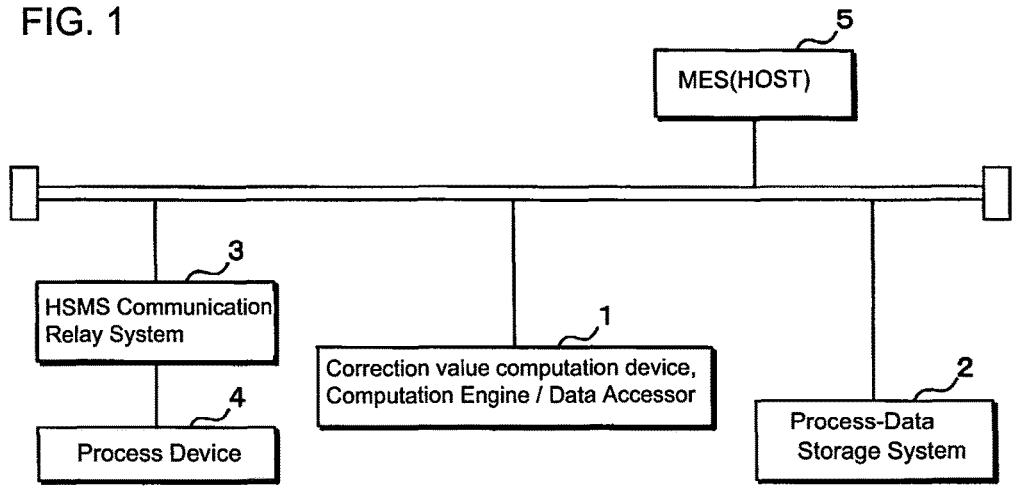
FIG. 1 is an example of a configuration of an online correction system.

The embodiments will now be described with reference to the accompanying drawings, wherein like reference numerals designate corresponding or identical elements throughout the various drawings.

Embodiment 1

FIG. 1 is an example of a configuration of an online correction system. An online correction system includes a correction value computation device 1, a process-data storage device 2, a high-speed message services (HSMS) communication relay system 3, a process device 4 (manufacturing apparatus), and a manufacturing execution system (MES) 5.

The process-data storage system 2 retains data related to past manufacturing processes. The data saved may be, for example, a recipe for process that was executed, values for parameters used to run a process, values measured by temperature sensors, pressure sensors, and gas flow sensors while a process is run, and a performance indicator for the process results, and the like.

The HSMS communication relay system 3 relays communication message sequences between devices. The HSMS communication system 3 detects a specific communication sequence and performs transmissions for various types of events (requests for correction value computation, requests for model updates) and receives replies for the correction value computation device 1 over a network. The HSMS communication system 3 also includes a function that communicates with the process device 4, the MES 5, and the like independently as needed, allowing the correction value computation results from the correction value computation device 1 to be reflected in the process run parameters for the process device 4.

The process device 4 executes a manufacturing process. For instance, a manufacturing process may be deposition, etching, cleaning, and the like.

The MES 5 controls all stages of semiconductor manufacturing.

Figure 2:
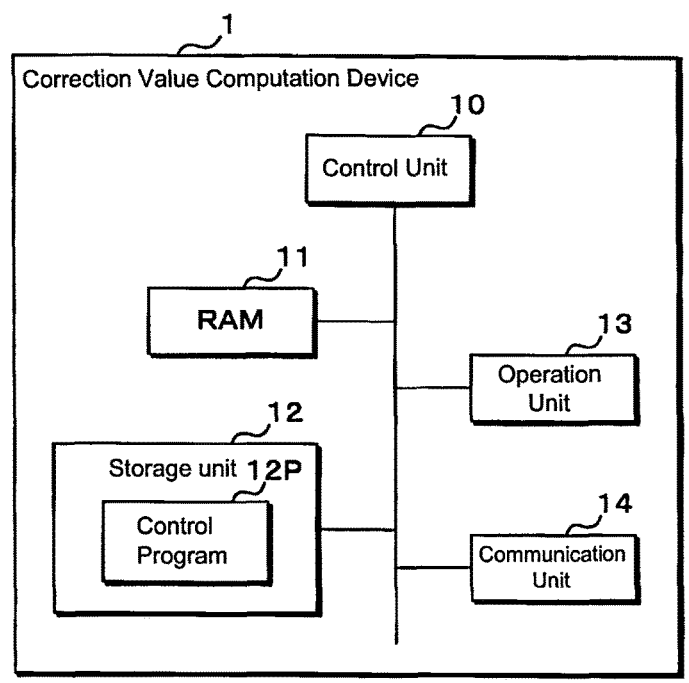
FIG. 2 is an example of a hardware configuration for a correction value computation device.

FIG. 2 is an example of a hardware configuration for a correction value computation device 1. The correction value computation device 1 may be configured from a general-purpose computer such as a server computer, or a personal computer, or the like. The correction value computation device 1 also includes a control unit 10, a random access memory (RAM) 11, a storage unit 12, and an operation unit 13, and a communication unit 14.

The control unit 10 may be a central processing unit (CPU), or a microprocessor unit (MPU), or the like. The control unit 10 loads a control program 12P stored in the storage unit 12 into RAM 11 as appropriate and runs the control program, controlling each above-described component and thereby functioning as the correction value computation device 1.

The RAM 11 may be a static RAM (SRAM), a dynamic RAM (DRAM), or a flash memory. The RAM 11 temporarily stores the various data generated when the control unit 10 runs various programs.

The storage unit 12 may be non-volatile memory such as an electrically erasable and programmable ROM (EE- PROM), or a flash memory, and the like. The control programs that is executed by the control unit 10 and various data are preliminarily stored in the storage unit 12.

The operation unit 13 may be a keyboard, a mouse, and the like whereby the user performs various input. The communication unit 14 communicates with the process device 4 and the MES 5.

Models used in the correction value computation device 1 are described. A model defines data to be acquired and a computational logic. The correction value computation device 1 captures various phenomena using a model, and expresses these phenomena as numerical formulas. Here, the correction value computation device 1 uses a model to transform a fluctuation phenomenon into a process element (referred to below as a "process fluctuation model"), and a model to transform a performance fluctuation into a process element (referred to below as a "process performance model").

A fluctuation phenomenon is a phenomenon that can be observed due to changes in the state of the process device 4. The change in the cumulative film thickness in the process tube of a chemical vapor deposition (CVD) process device 4 is such a phenomenon. A process element is physical factor, a chemical factor, or a process parameter that is a contributing factor, which affects an individual process result (performance) in the process device 4. For example, process parameter may be a temperature, a gas flow rate, a pressure, a voltage, a plasma state, or a solution concentration. A performance fluctuation is a change in a performance indicator value.

A fluctuation phenomenon in a device may be converted into a fluctuation amount for each process element using a process fluctuation model (device model). Additionally, the fluctuation in each process element may be converted into a fluctuation amount for a performance indicator, and the fluctuation in a performance indicator may be converted into a fluctuation amount for each process element using the process performance model (process model). The process fluctuation model and the process performance model may be used to convert the fluctuation in a performance indicator into a fluctuation amount for a process element.

Figure 3:
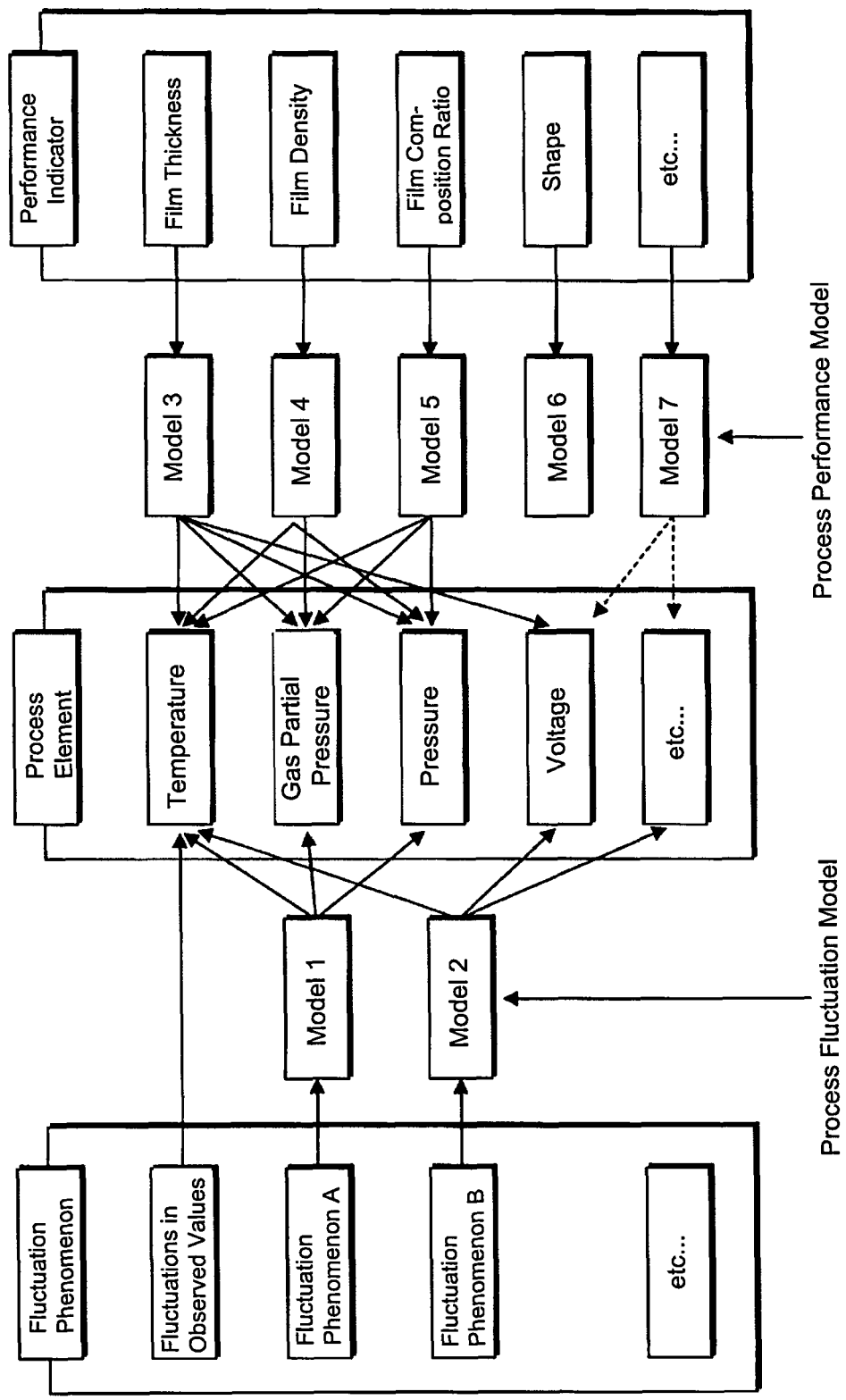
FIG. 3 schematically illustrates examples of a process fluctuation model, and a process performance model.

FIG. 3 schematically illustrates examples of a process fluctuation model, and a process performance model. Model 1 and Model 2 are process fluctuation models. Model 3 through Model 7 are process performance models. Model 1 indicates that a fluctuation phenomenon A is associated with the temperature, gas partial pressure, and pressure process elements. Model 3 indicates that the performance indicator for film thickness is associated with the temperature, gas partial pressure, and voltage process elements. Here, a strategy for a specific process defines a model representing the relationship between a process element and a performance indicator, and a model representing a relationship between a fluctuation phenomenon that affects the process element, and the process element.

The above-represented process fluctuation model, process performance model, and strategy are created using past process results.

Figure 4:
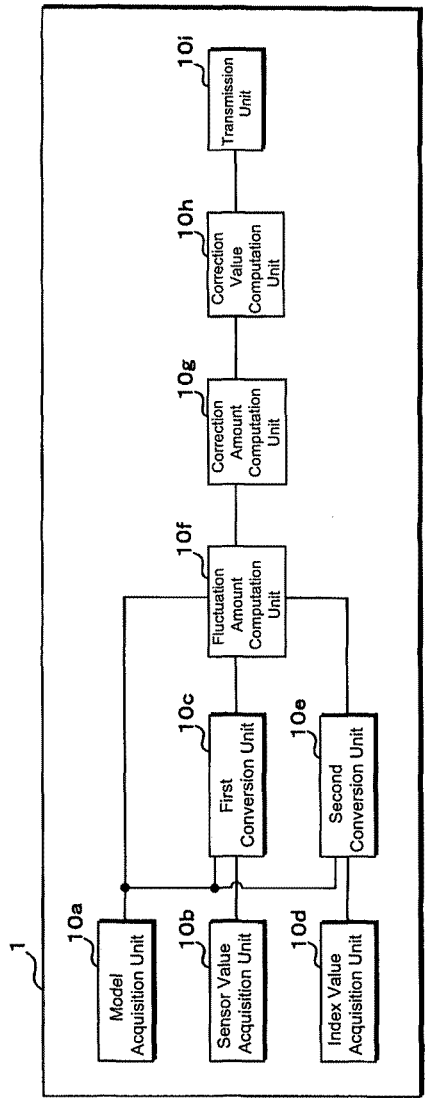
FIG. 4 is a block diagram of functions implemented by a control unit in the correction value computation device.

FIG. 4 is a block diagram of functions implemented by the control unit 10 in the correction value computation device 1. The control unit 10 executes the functions of a model acquisition unit (10*a*), a sensor value acquisition unit (10*b*), a first conversion unit (10*c*), an index value acquisition unit (10*d*), a second conversion unit (10*e*), a fluctuation amount computation unit (10*f*, a correction amount computation unit (10*g*), a correction value computation unit (10*h*), and a transmission unit (10*i*) on the basis of each program included in the control program (12P).

Figure 5A:
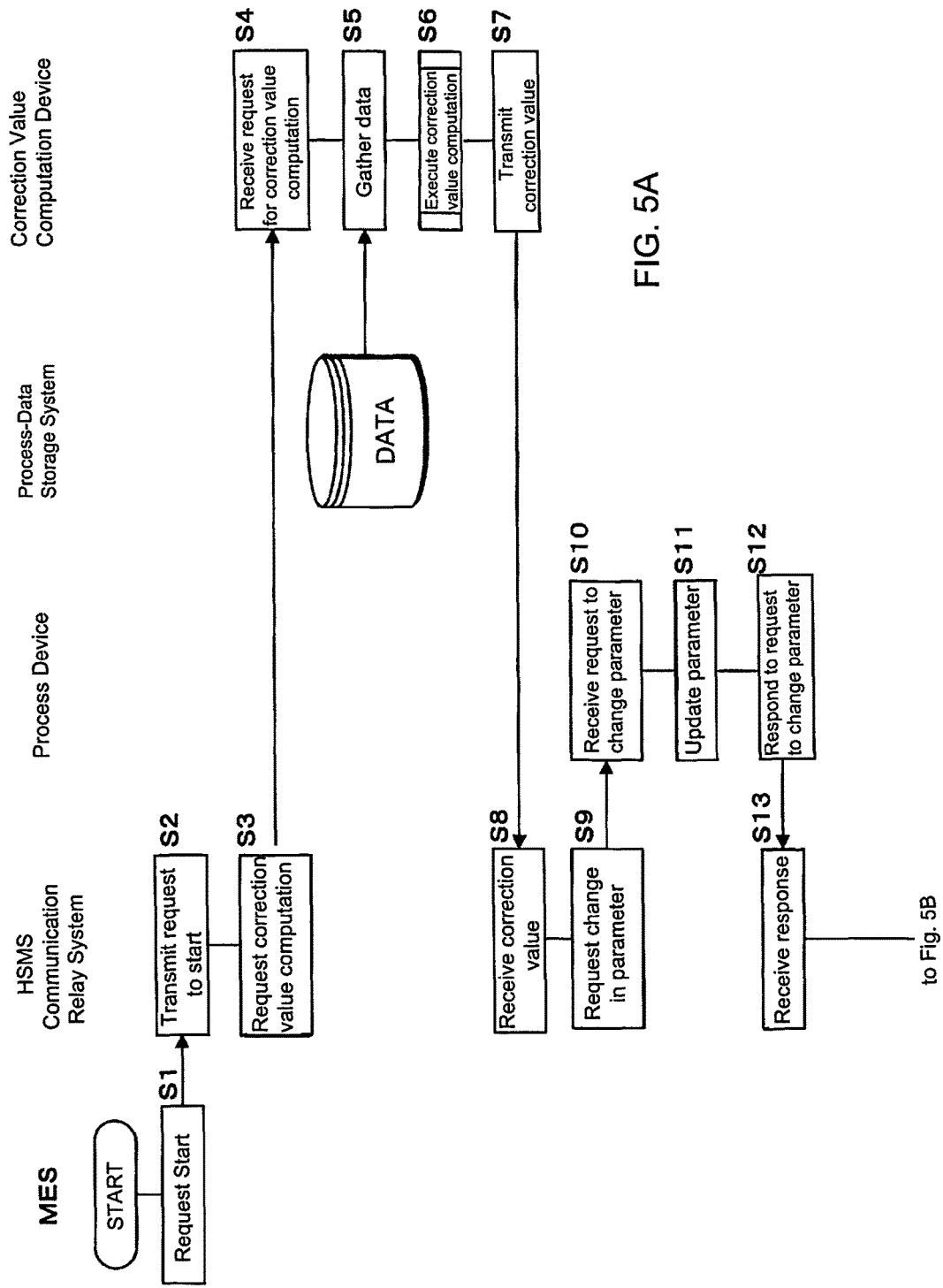
FIG. 5A is a sequence chart illustrating an example of operations in the online correction system.

Operations in the online correction system are now described. FIG. 5A and FIG. 5B are sequence charts illustrating exemplary operations in the online correction system. The MES 5 transmits a request to start a process to the HSMS communication relay system 3 (step S1). The HSMS communication relay system 3 receives the request to start a process transmitted by the MES 5 (step S2). The HSMS communication relay system 3 transmits a request to compute a correction value to the correction value computation device 1 (step S3). The correction value computation device 1 receives the request to compute a correction value from the HSMS communication relay system 3 (step S4). The correction value computation device 1 collects data from the process-data storage system 2 to compute a correction value (step S5). In step S5, the control unit 10 (model acquisition unit (10*a*)) in the correction value computation device 1 acquires a process fluctuation model, a process performance model, and a strategy. The correction value computation device 1 computes a correction value (step S6). The control unit 10 (transmission unit (10*i*)) in the correction value computation device 1 transmits the computed correction values to the HSMS communication relay system 3 (step S7). The HSMS communication relay system 3 receives the correction value from the correction value computation device 1 (step S8). The HSMS communication relay system 3 transmits a parameter change request and the correction value received to the process device 4, so that the process device 4 changes parameters (control parameters) on the basis of the correction value received by the HSMS communication relay system 3 (step S9). The process device 4 receives the parameter change request and the correction value from the HSMS communication relay system 3 (step S10). The process device 4 proceeds to update the parameters in accordance with the parameter change request and the correction value received from the HSMS communication relay system 3 (step S11). The process device 4 transmits a response to the HSMS communication relay system 3 reporting the change in the parameters (step S12). The HSMS communication relay system 3 receives the response from the process device 4 reporting the change in parameters (step S13). The HSMS communication relay system 3 transmits the request to start a process to the process device 4 (step S14). The process device 4 receives the request to start the process (step S15). The process device 4 transmits a response to the HSMS communication relay system 3 reporting the starting of the process (step S16). The process device 4 executes the process after step S16 (S18)[//]. The HSMS communication relay system 3 receives the response regarding the request to start the process (step S17). The HSMS communication relay system 3 transmits the response to the MES 5 regarding the request to start the process (step S19). The MES 5 receives the response regarding the request to start the process relayed by the HSMS communication relay system 3 (step S20).

Figure 6:
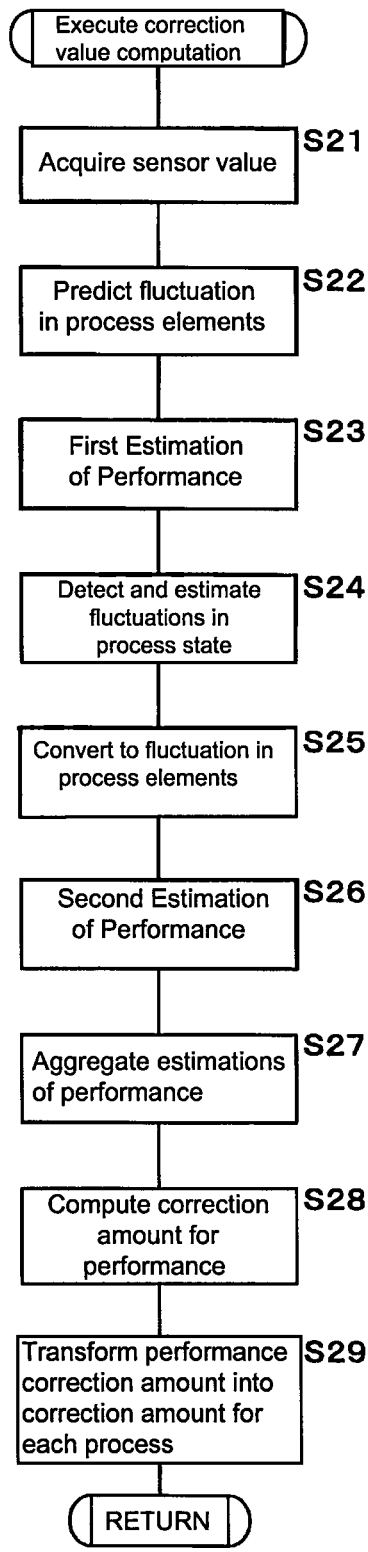
FIG. 6 is a flowchart illustrating a sequence of processing carried out by the correction value computation device to compute a correction value.

Described is a procedure executed by the correction value computation device 1 for computing a correction value. FIG. 6 is a flowchart illustrating the procedure executed by the correction value computation device 1 to compute a correction value. The control unit 10 (sensor value acquisition unit (10*b*)) in the correction value computation device 1 acquires sensor values from sensors monitoring fluctuations in a process element, or sensor values used to estimate the fluctuations in the process element (step S21). The voltage, the temperature, the gas flow rate, the pressure, and the like are process elements that can be monitored using sensors.

For instance, the plasma state in a dry etching device, or a plasma CVD device is an example of a process element for which sensor values are used to estimate fluctuations. A plasma state cannot be measured directly. Therefore, an optical sensor is used to measure the light emission intensity of light emitted from the plasma. The plasma state can be identified from measured light emission intensity. The light emitted from the plasma enters a beam splitter, and a distribution of the light emission intensity measured with respect to wavelength. This plasma state is identified the distribution of the light emission intensity with respect to wavelength.

The control unit 10 (first conversion units (10c)) uses the process fluctuation model to estimate the fluctuation in the process elements from the acquired sensor value (step S22). In the example illustrated in FIG. 3, the control unit 10 uses Model 1 to transform the fluctuations due to the fluctuation phenomenon A into the fluctuations in the process elements such as the temperature, the gas partial pressure, and the pressure. Further, the control unit 10 uses Model 2 to convert the fluctuations due to the fluctuation phenomenon B into the fluctuations in the process elements such as the temperature, the voltage, and the like. Once the fluctuations in the process elements are obtained for all the fluctuation phenomena being monitored using the process fluctuation model, the control unit 10 (fluctuation amount computation unit (10f) uses the process performance model to transform the fluctuations in the process elements into fluctuations in a performance indicator (step S23).

The control unit 10 (index value acquisition unit (10d)) acquires an index value indicative of the fluctuation in a process state. The index value may be acquired from the process device 4, or maybe acquired from the process-data storage system 2 which stores an operation history for the process device 4. Additionally, the control unit 10 (index value acquisition unit (10d)) may receive values for computing the index value from the process device 4 and the process-data storage system 2. The control unit 10 detects and estimates a fluctuation in the process state based on the index value (step S24). A fluctuation in a process state is a measurement of the chronological changes in a component or a device, the fluctuations in a previous process, or the fluctuations indirectly affecting a process element due to some factor. While the direct fluctuations in a process element are detected and estimated in the above-mentioned step S22, step S24 defines the phenomena that indirectly affect the process elements. For instance, the deterioration of the insulating material in a manufacturing apparatus cause changes in the temperature effect over time.

The control unit 10 (second conversion unit (10e)) uses the process fluctuation model to convert the results of detecting and estimating the fluctuation in the process state into a fluctuation in a process element (step S25). The control unit 10 (fluctuation amount computation unit (10f)) then uses the process performance model to transform the fluctuation in the process element into a fluctuation in the performance indicator (step S26.)

Steps S24 through S26 may be carried out before step S21 through S23. In addition, if the control unit 10 has surplus processing capacity, steps S21 through S23 and steps S24 through S26 may be processed in parallel.

The control unit 10 combines the fluctuation in the performance indicator obtained in step S23 and the fluctuation in the performance indicator obtained in step S26 to estimate the performance of the process (step S27). Here, the manner of estimating the performance of the process from the two performance indicators may also be carried out using a model and a strategy.

The control unit 10 (correction amount computation unit (10g)) compares the results of estimating the performance of the process and a target value and a target range (defined value) for each performance indicator acquired from the MES 5, to compute a correction amount for each of the performance indicators (step S28).

The control unit 10 (correction value computation unit (10h)) transforms the correction amount for performance indicator into a correction amount for each of the process elements (step S29). The control unit 10 (correction value computation unit (10h)), taking into account a correction to the fluctuation in the process elements already computed in step S27, optimizes the correction amount so that a performance indicator falls within a targeted range. The control unit 10 terminates the procedure for computing the correction values. Here, multiple performance indicator values conceivably have a trade-off relationship. In that case, a Pareto optimal solution may be used to balance the index values. The computation and optimization of the correction amount for each process element is defined in a model and a strategy.

In the first embodiment, the correction value computation device 1 makes the corrections in the process element that is the main cause of the fluctuation phenomenon, and thereby improves the repeatability of the process. Improving the repeatability of a process reduces the fluctuations in multiple performance indicators simultaneously.

An example of a model and a strategy is described that is used in the correction value computation device 1. In the example, the correction value computation device 1 reduces the fluctuations in a batch furnace used in a chemical vapor deposition process.

The model is described that is used in estimating the fluctuation in the process elements (step S22 in FIG. 6), and in the first estimation of the performance (step S23). A model representing the relationship between base fluctuation values for a gas flowsensor and an actual flow rate fluctuation amount while executing a process is described as an example of a process fluctuation model.

Figure 7:
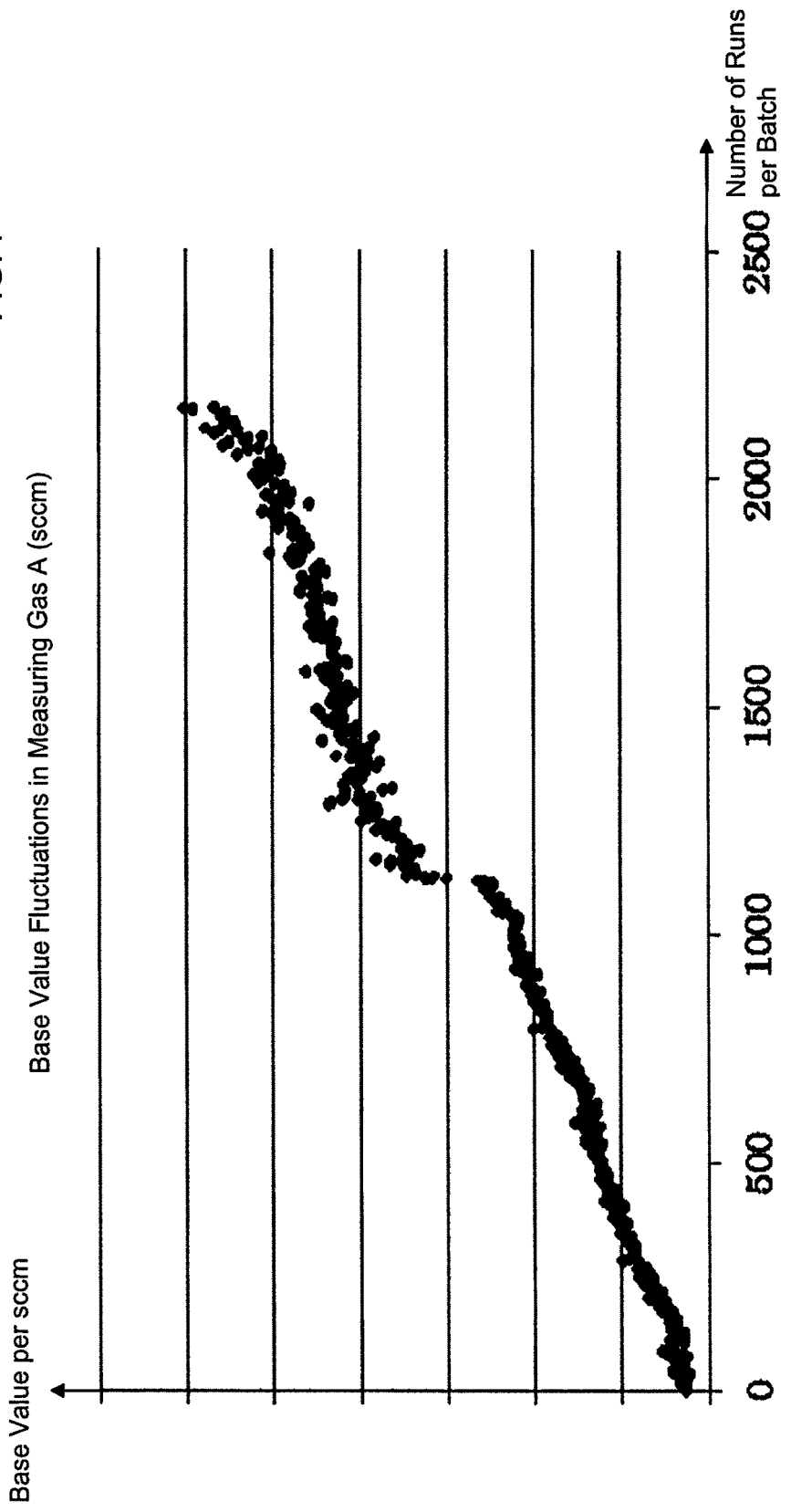
FIG. 7 is a graph illustrating base value fluctuations in gas flow sensor values.

FIG. 7 is a graph illustrating base value fluctuations in gas flow sensor values. Illustrated therein are the base fluctuation values for the sensor readings from a gas flow sensor measuring a gas A, which is a process gas. The vertical axis represents output values in units of standard cubic centimeters per minute (sccm). The horizontal axis represents the number of runs (the number of times the process is executed). A base value may be, for example, a value output by the sensor while the process device is in a normal state, such as before the process starts. If the process device 4 and the gas flow sensor are in an ideal state where there are no fluctuations in the process device 4 and the gas flow sensor, the base value is always the same. However, in reality the base value fluctuates in accordance with an increase in the number of runs as illustrated in FIG. 7. Note that a detection step may be added to the process recipe for detecting the base value data, and the results of the detection stored in the process-data storage system 2.

Figure 8:
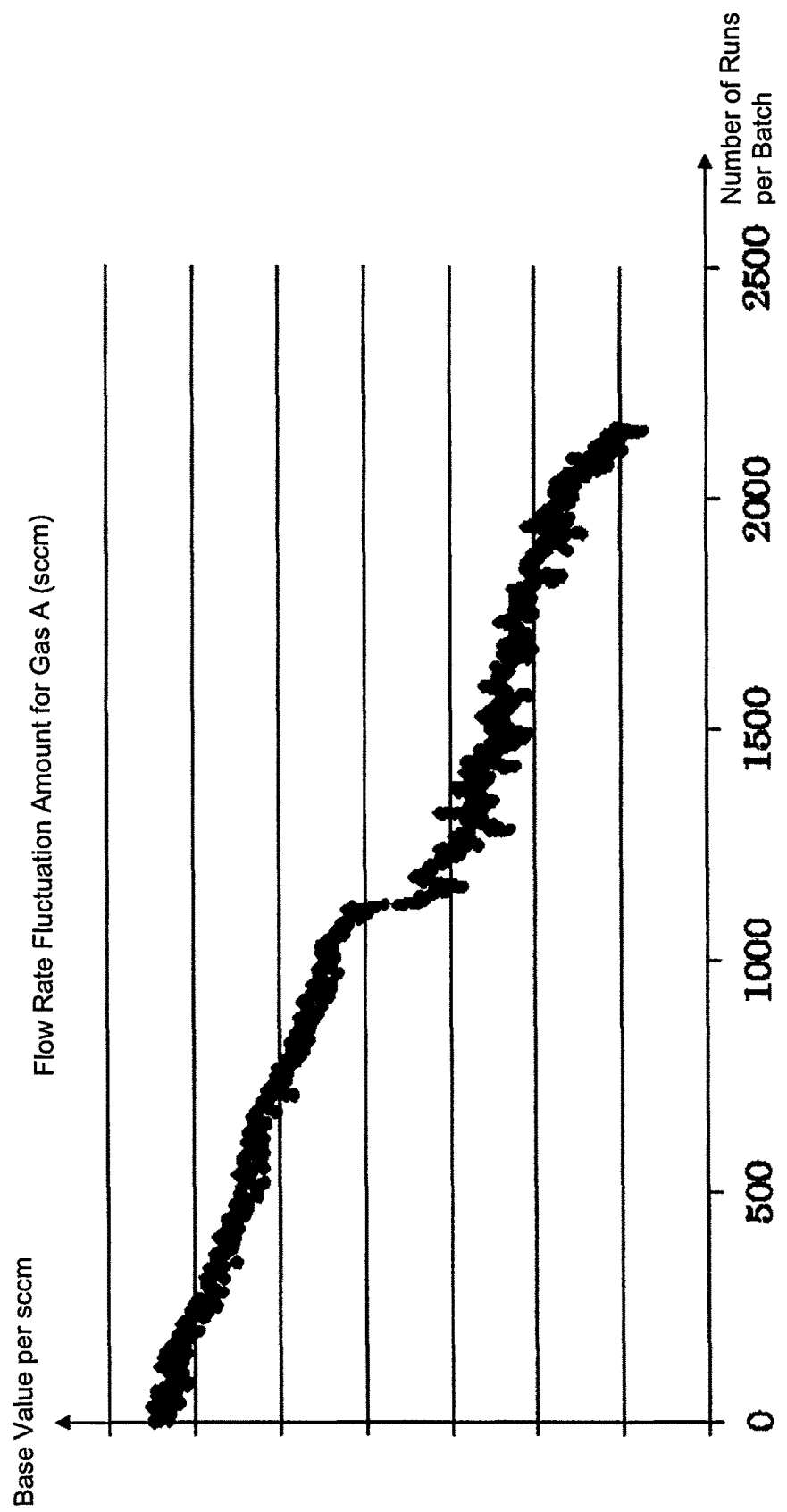
FIG. 8 is a graph illustrating estimated values for flow rate fluctuation amounts.

As illustrated in FIG. 7, the base value increases as the number of runs increases; therefore, the gas flow sensor outputs a value larger than the actual flow rate. Consequently, the actual flow rate predictably decreases as the base value increases while executing the process. Accordingly, the process fluctuation model representing the relationship between the base fluctuation values for a gas flow sensor, and the actual flow rate fluctuation amount while a process is executed can be expressed using the formula: actual flow rate while executing process=commanded supply rate−base value for gas flow sensor. FIG. 8 is a graph illustrating estimated values for flow rate fluctuation amounts. The vertical axis represents the actual flow rate fluctuation amount during a process run. The actual flow rate fluctuation amounts are measured in standard cubic centimeters per minute (sccm). The horizontal axis represents the number of runs.

A model representing the relationship between a gas flow rate fluctuation amount while executing a process and a film thickness fluctuation amount is described as an example of a process performance model. The relationship between the flow rate of a gas and a deposition rate (which approximately equals the film thickness) may be acquired through linear approximation. Thus, an approximation coefficient (Sensitivity) may be obtained separately through experimentation. With the approximation coefficient obtained, a process performance model representing a relationship between a gas flow rate fluctuation amount and a film thickness fluctuation amount may be expressed as:

Film Thickness Fluctuation Amount=Sensitivity×Gas Flow Rate Fluctuation Amount

Figure 9:
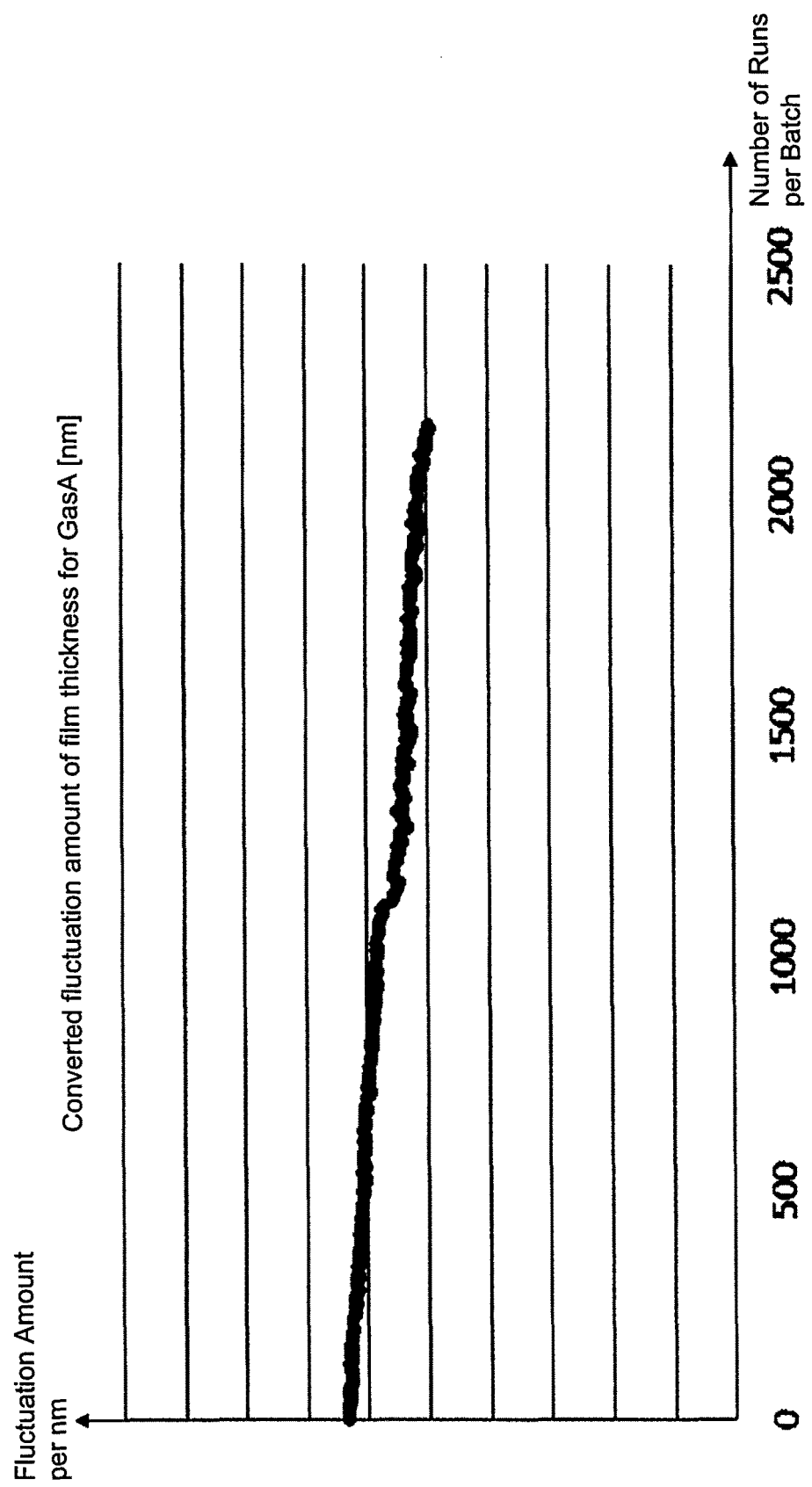
FIG. 9 is a graph illustrating film thickness fluctuation amounts.

FIG. 9 is a graph illustrating film thickness fluctuation amounts. The vertical axis represents the film thickness fluctuation amounts, with units in nanometers (nm). The horizontal axis represents the number of runs. The graph illustrating film thickness fluctuation amounts in FIG. 9 is obtained from the flow rate fluctuation amounts illustrated in FIG. 8 and the above-mentioned process performance model.

Estimations of the performance of other gas flow sensors using base fluctuation values are carried out in the same manner. The process fluctuation model and process performance model are also obtained through experiments for sensors besides the gas flow sensor, such as pressure sensors and temperature sensors.

A model used in detecting and estimating the fluctuations in the process state (step S24), and in the second estimation of the performance (step S26) is described. The fluctuation in the process elements indirectly influenced by the cumulative film thickness inside a tube is provided as an example. A tube is the primary segment of a batch furnace that forms a space for carrying out a manufacturing process. The tube is composed of quartz and the like.

As the manufacturing process is carried out, the cumulative film thickness in the tube is the thickness of a film formed on the inner wall of the tube and on each component. The process state on a product wafer changes due to this cumulative film thickness. Cleaning may be performed per run to reduce the effects of the cumulative film thickness. However, cleaning the apparatus per run leads to reduced manufacturing capability, and increases manufacturing costs due to the increased use of the cleaning gas, abrasion of the quartz components, and the like. Therefore, generally a manufacturing process is run within a permissible range of performance fluctuations, which are dependent on the cumulative film thickness.

The fluctuations in the temperature, and the gas concentration on a wafer are provided as an example of the fluctuations in the process state due to the cumulative film thickness. The cumulative film thickness changes the transmittance, absorbance, and reflectivity of heat from a heater, and changes the surface temperature of a wafer being processed. Additionally, the quartz components become worn as the cleaning process removes the cumulative film thickness, bringing about changes in heat effect and gas consumption.

Figure 10:
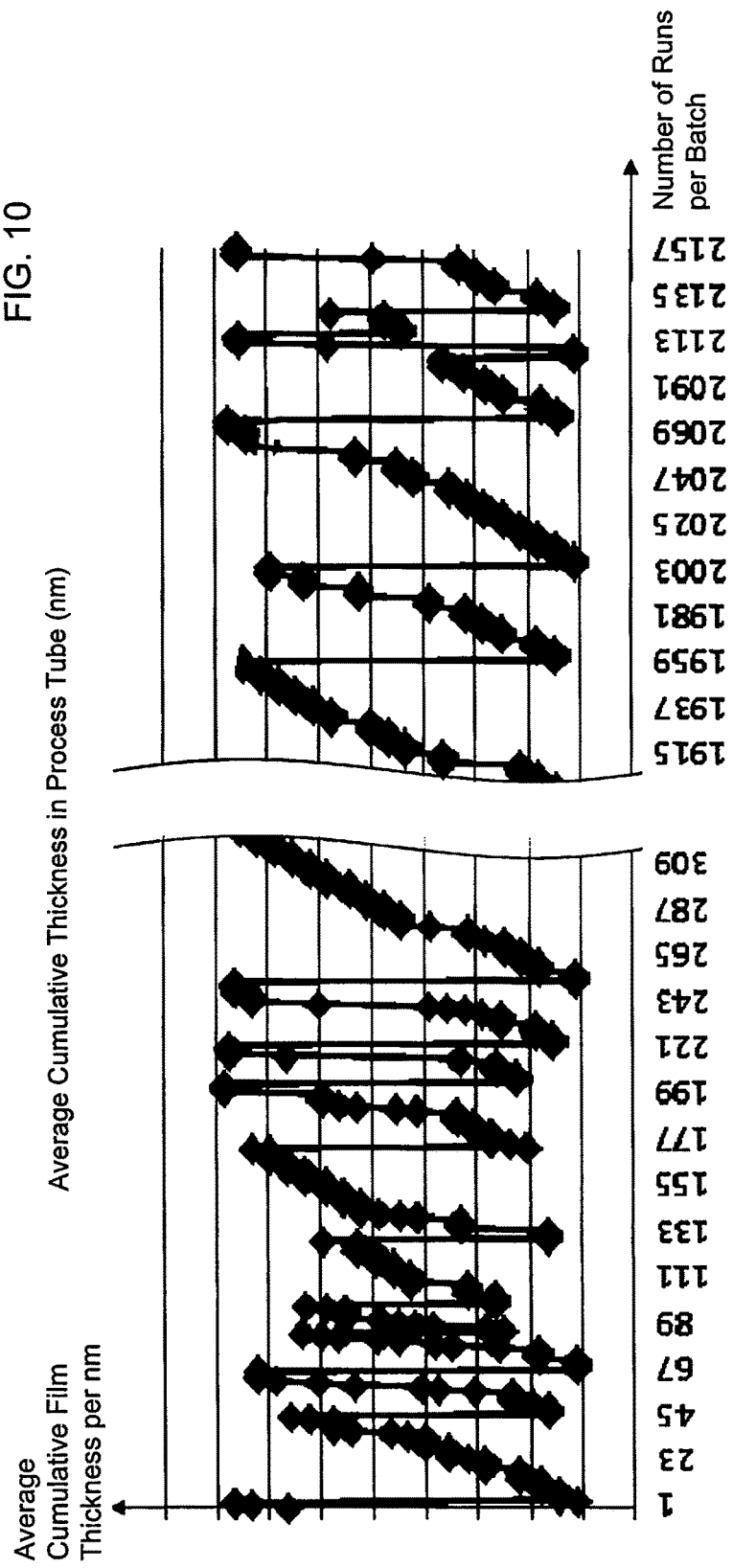
FIG. 10 is a graph illustrating fluctuations in an average cumulative film thickness.

The relationship between the cumulative film thickness and the number of runs is modeled through experiment, or the like. The cumulative film thickness increases in proportion to the number of runs, and decreases due to the cleaning process. FIG. 10 is a graph illustrating fluctuations in an average accumulated film thickness. The vertical axis represents the average cumulative film thickness, with units in nanometers (nm). The horizontal axis represents the number of runs.

Figure 11:
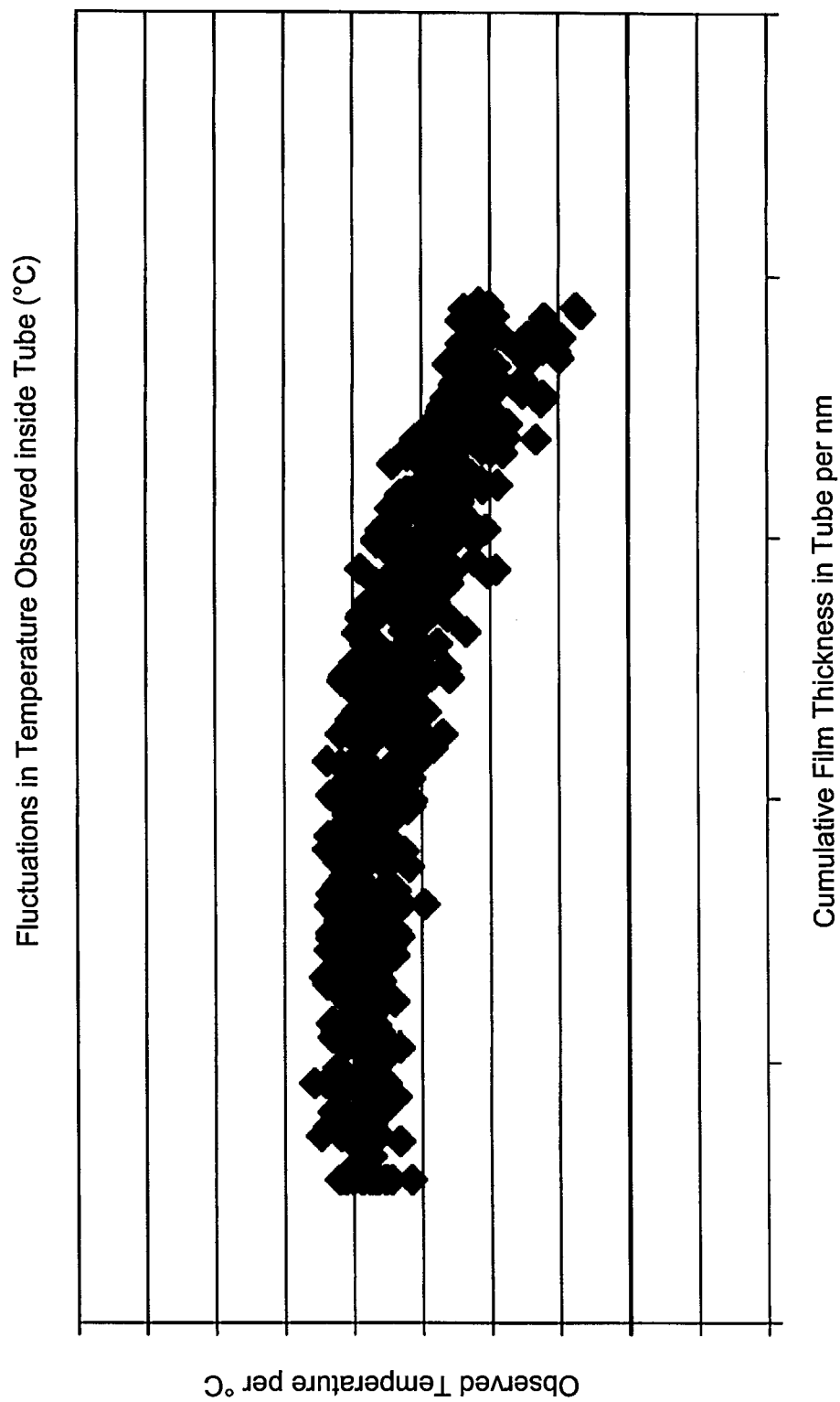
FIG. 11 is a graph illustrating a relationship between a cumulative film thickness and temperatures observed inside a tube.
Figure 12:
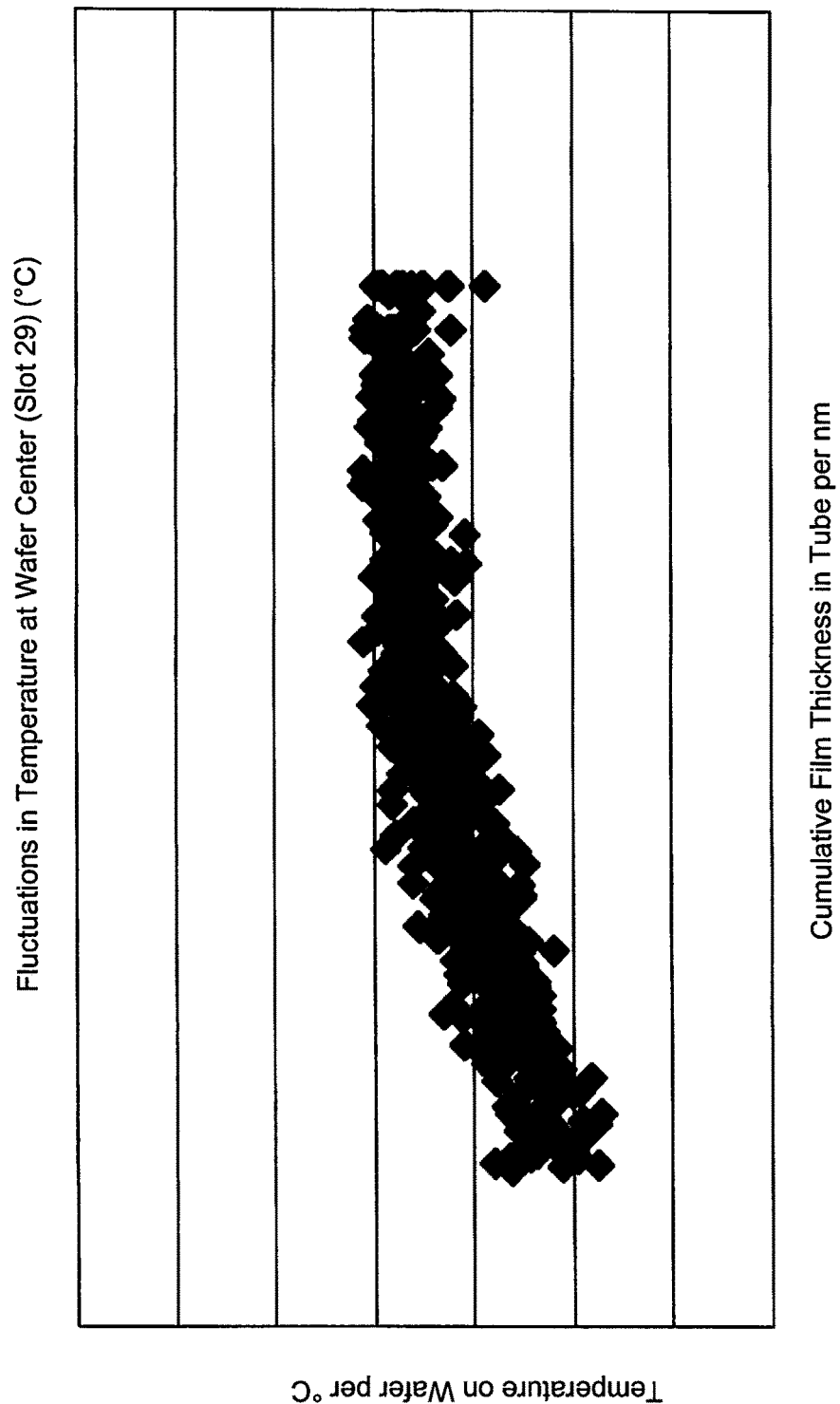
FIG. 12 is a graph illustrating a relationship between a cumulative film thickness and temperatures observed on a wafer.

A process fluctuation model is described that is used to transform the cumulative film thickness into temperature fluctuations. FIG. 11 is a graph illustrating a relationship between a cumulative film thickness and temperatures observed inside a tube. FIG. 12 is a graph illustrating a relationship between a cumulative film thickness and temperatures observed on a wafer. The vertical axes in FIG. 11 and FIG. 12 both represent temperature in Celsius. The horizontal axes in FIG. 11 and FIG. 12 both represent the cumulative film thickness inside a tube in nanometers (nm). Models are created for the relationships in FIG. 11 and FIG. 12, and the models treated as process fluctuation models.

A cumulative film thickness can be estimated from the number of runs using the above-illustrated models. The estimated cumulative film thickness allows an estimation of the temperature inside the tube, and on the wafer.

The changes in temperature depend on, and change with the type of process, the device configuration, and the mode of temperature control. Therefore, a model is created for each type of process, device configuration, and mode of temperature control. A model used for estimating the temperature on the wafer is also created for each slot. The estimated temperature on the wafer may be used as an explanatory variable in estimating a process result across the upper part to the lower part of the tube (the inter-surface direction of the wafer).

Figure 13:
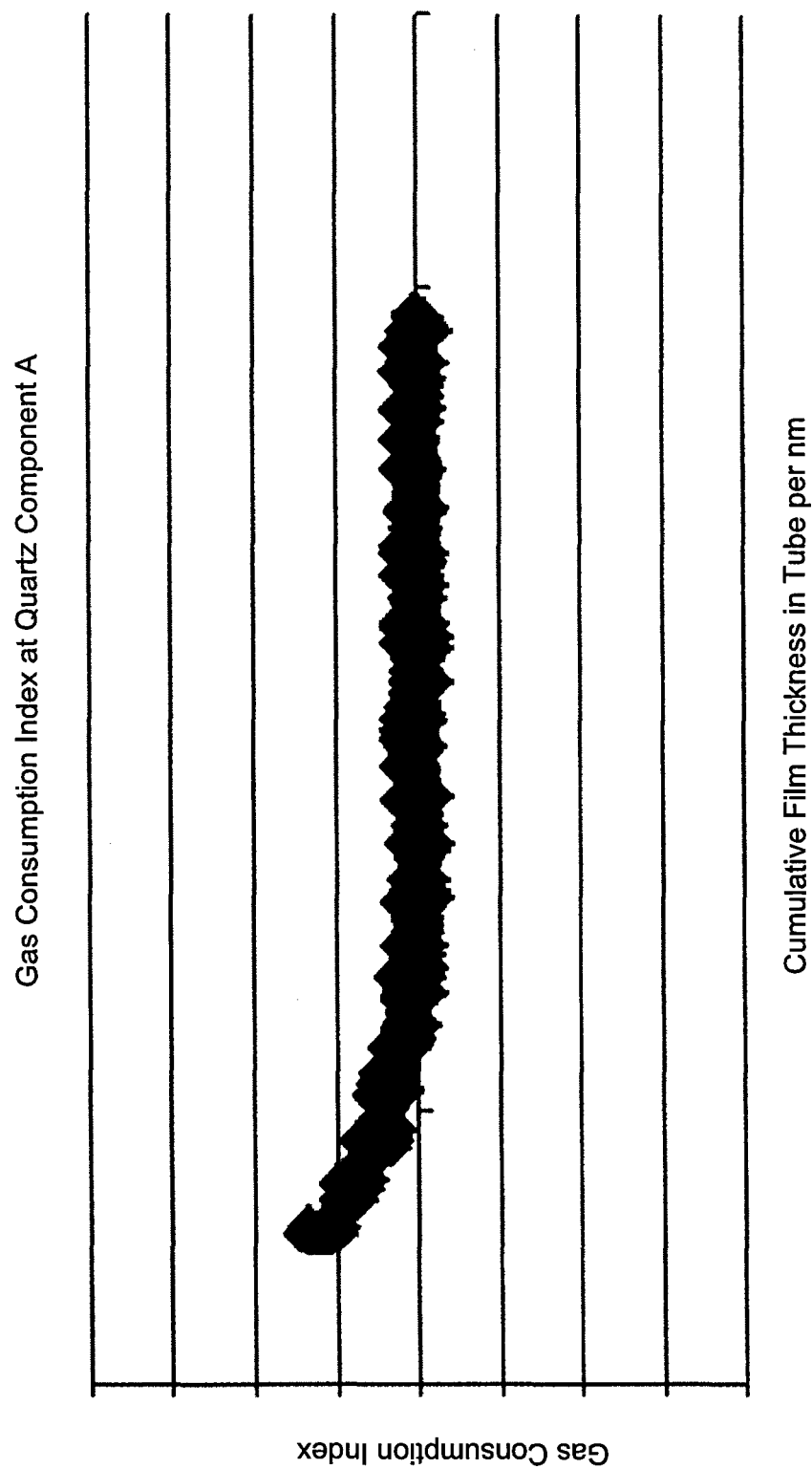
FIG. 13 is a graph illustrating a relationship between a film thickness inside the tube and a gas consumption index of a component A.
Figure 14:
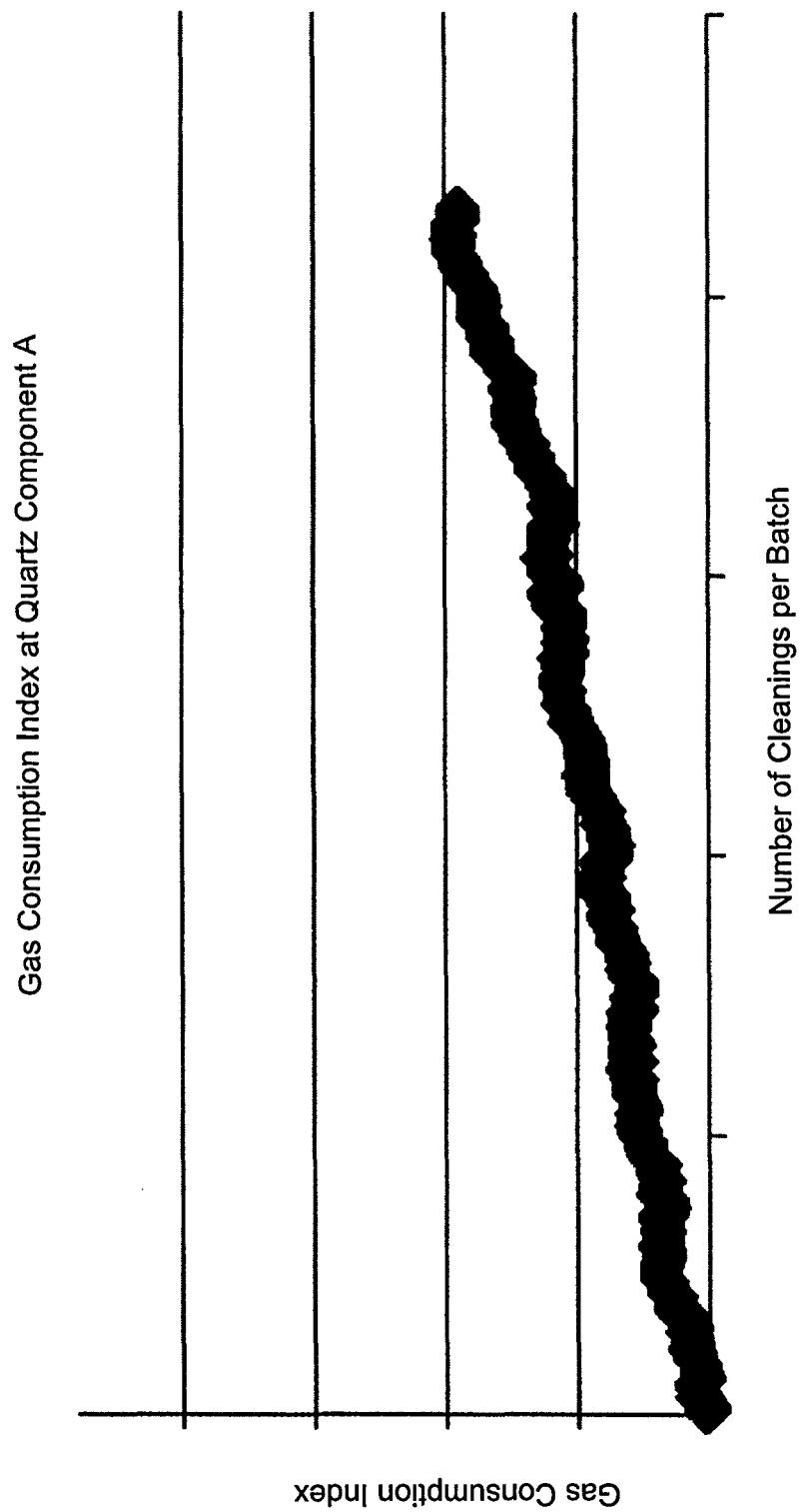
FIG. 14 is a graph illustrating a relationship between a number of cleanings and a gas consumption index of a component A.

The fluctuation in the gas concentration on the wafer is described. The gas consumption increases with the degradation of a quartz component (taken as "component A") inside the tube, decreasing the amount of gas supplied to a wafer in the process area. The cumulative film thickness and the number of cleanings result in fluctuations in the gas consumption of component A. FIG. 13 is a graph illustrating a relationship between a film thickness inside the tube and a gas consumption index for the component A. The vertical axis represents the gas consumption index, and the horizontal axis represents the cumulative film thickness. FIG. 14 is a graph illustrating a relationship between a number of cleanings and the gas consumption index of the component A. The vertical axis represents the gas consumption index, and the horizontal axis represents the number of cleanings. Models are created for the relationships presented in these graphs. In the same manner that the cumulative film thickness of the tube influences the temperature or the gas consumption, multiple phenomena are similarly compounded and generated; therefore, a strategy is to be capable of combining multiple models, and expressing changes in process parameters. Fluctuations in a process state may be detected and estimated using the above-described model.

A process fluctuation model is described that is used to convert the fluctuations in a process state into the fluctuations in a process element. The process fluctuation model is used to convert the fluctuations in the above-described process state into a fluctuation in a process element, that is, into a fluctuation amount for a parameter that can be controlled and adjusted.

Specifically, a model used to convert the cumulative film thickness in the tube into fluctuations in the temperature on a wafer is described. In the process assumed here, the temperature within the tube is controllable in three zones; therefore, the fluctuations in the temperature on the wafer are converted into a fluctuation amount for an object being controlled (heater output, or temperature sensor in the object being controlled, and the like) for each zone. At that point, a process model is used that takes into account the interference among multiple control zones to perform the conversion.

Figure 15:
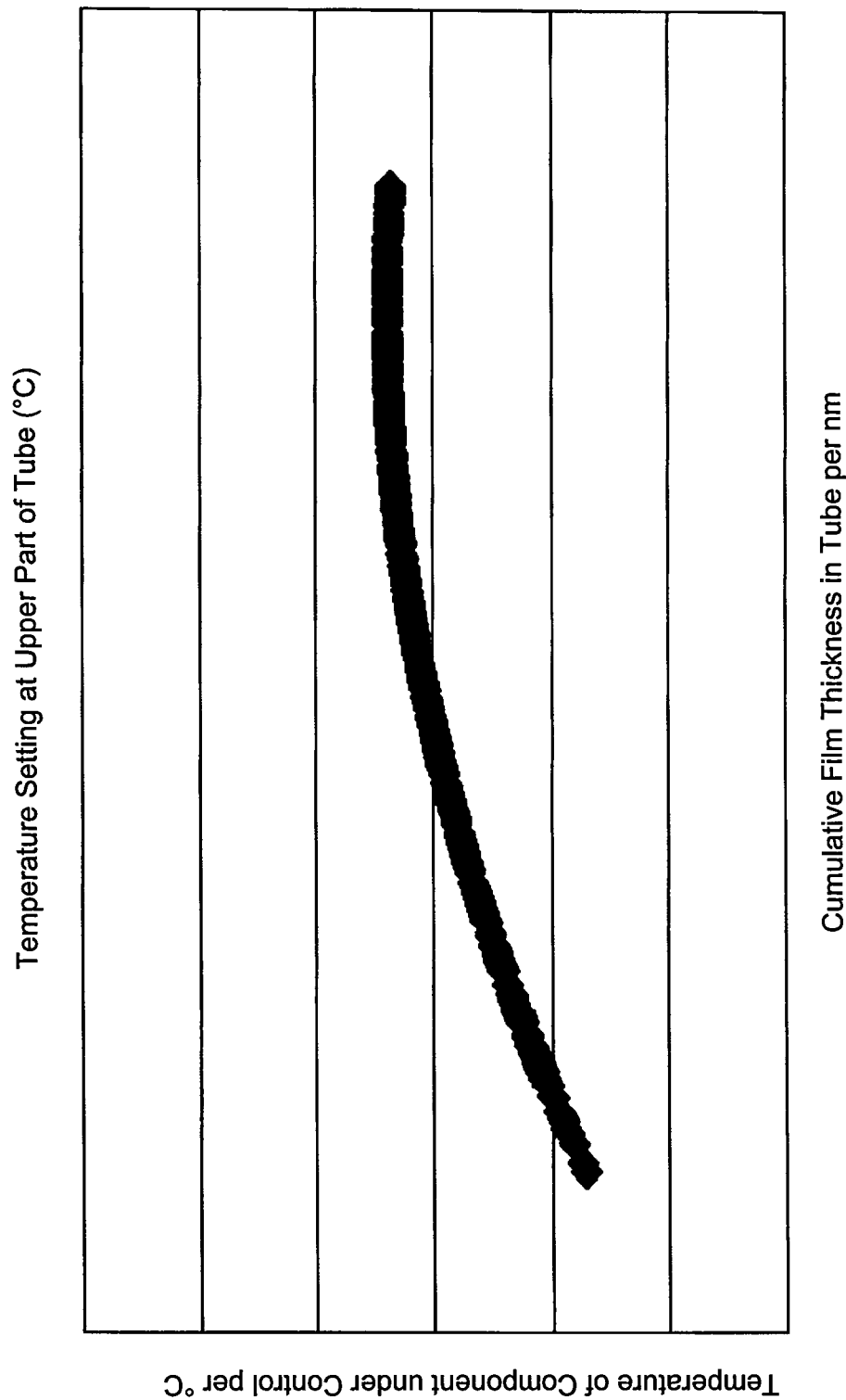
FIG. 15 is a graph illustrating the temperature setting at an upper part of the tube.
Figure 16:
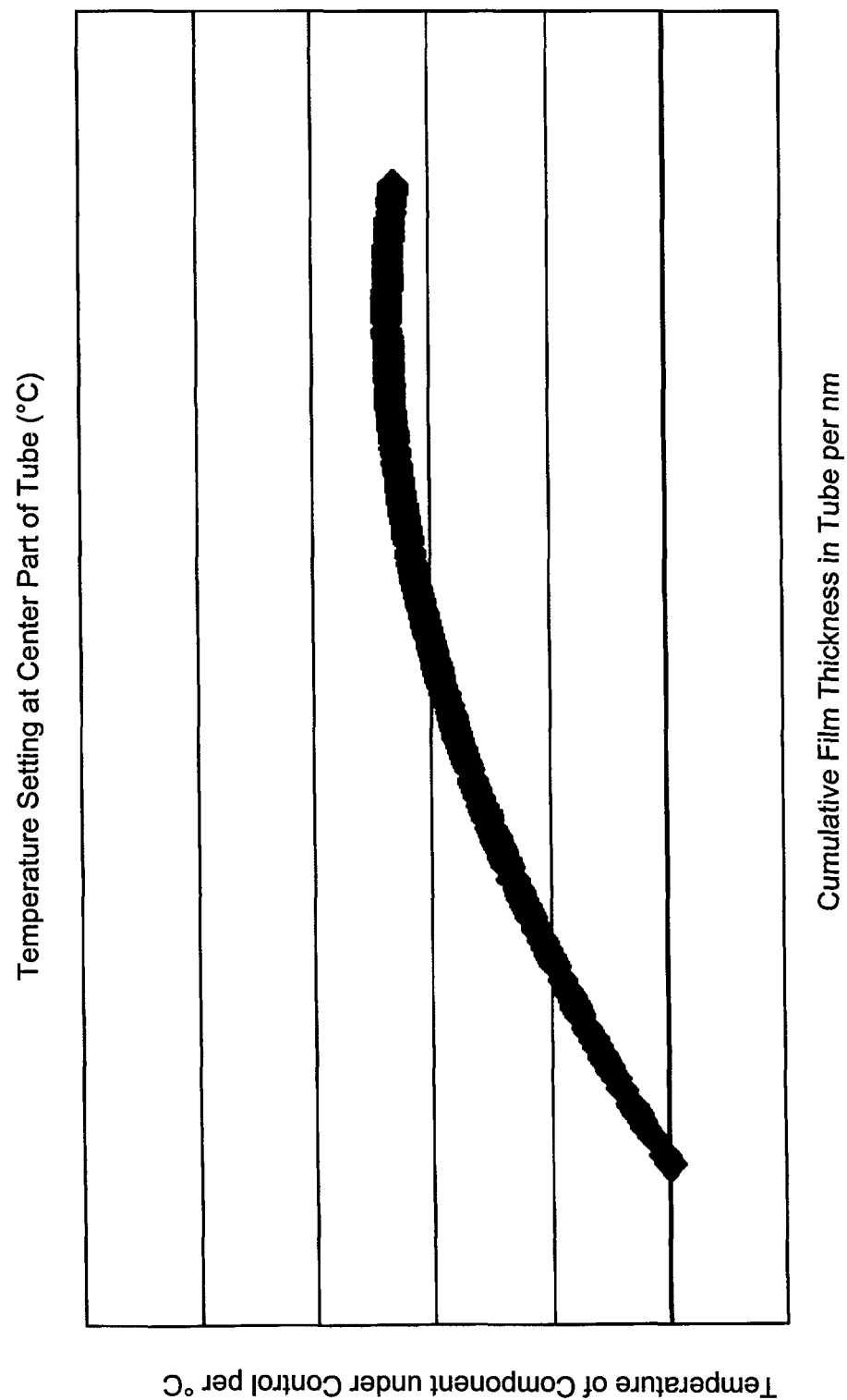
FIG. 16 is a graph illustrating the temperature setting at a center part of the tube.
Figure 17:
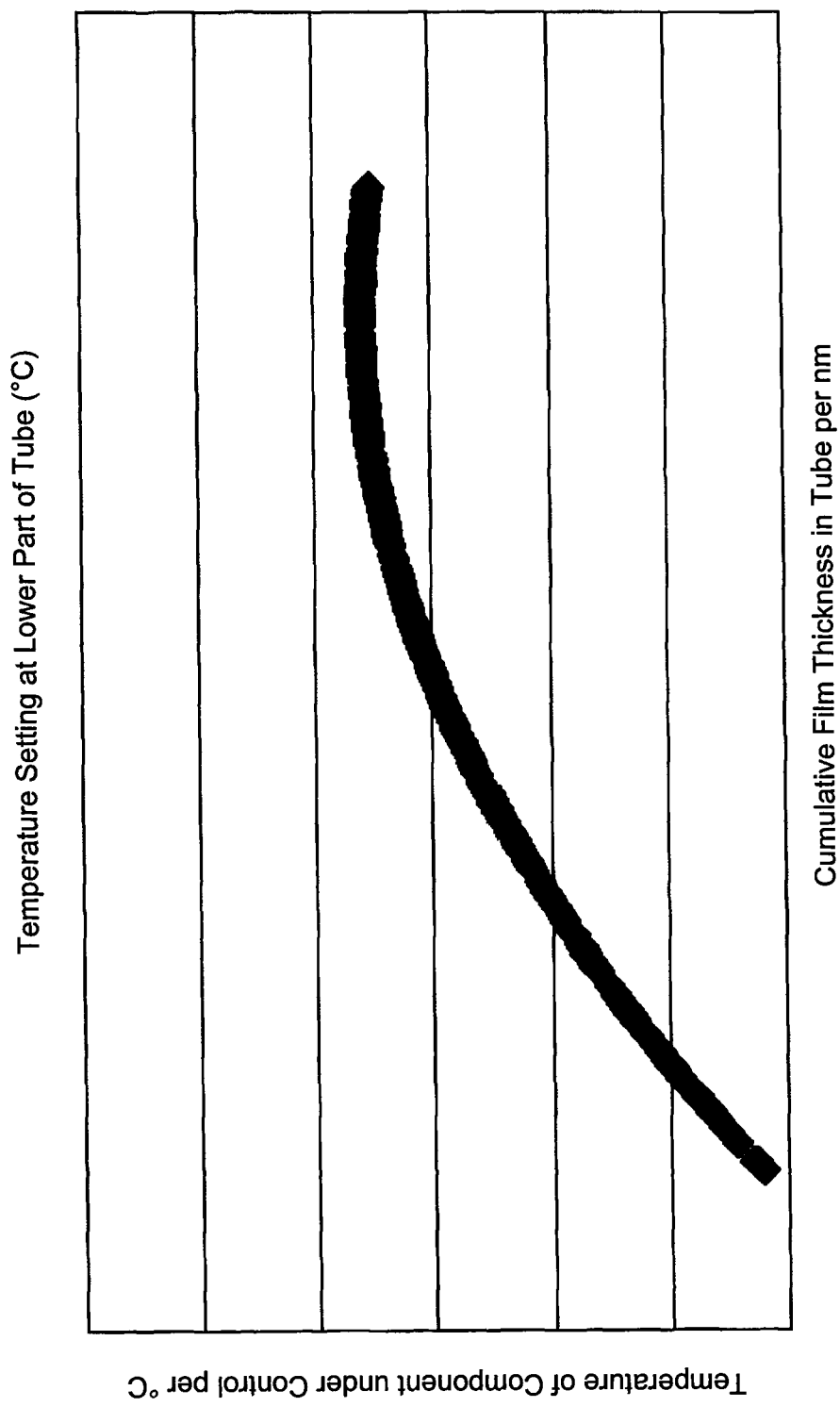
FIG. 17 is a graph illustrating the temperature setting at a lower part of the tube.

The fluctuations are converted into temperature settings for each of the zones (the upper part of the tube, the center part of the tube, and the lower part of the tube) using a process model that takes into account the heater interference. FIG. 15 is a graph illustrating the temperature setting at the upper part of the tube. FIG. 16 is a graph illustrating the temperature setting at the center part of the tube. FIG. 17 is a graph illustrating the temperature setting at the lower part of the tube. The horizontal axes in FIG. 15, FIG. 16, and FIG. 17 represent the cumulative film thickness inside a tube in nanometers (nm). The vertical axes represent the temperature of the object being controlled, in other words, a control temperature for a heater in Celsius. The graphs in FIG. 15, FIG. 16, and FIG. 17 illustrate the transformation of the control temperature on the basis of the previously presented FIG. 12, taking into account the interference between the heaters.

A case is described where the fluctuations in the gas concentration on the wafer caused by the deterioration of the quartz components are converted into a gas flow rate. As previously described, the fluctuations in the gas concentration on the wafer caused by the deterioration of the quartz components are dependent on two factors: the cumulative film thickness in the tube (refer to FIG. 13), and the number of cleanings (refer to FIG. 14). These two factors are combined, and the gas supply rate is obtained. Three types of gases are used: gas A, gas B, and gas C. Assuming the flow ratio for these gases is constant, it is possible to obtain a correction amount for each of the gas supply rates.

A process performance model is described that is used to transform a fluctuation amount in a process element into a performance fluctuation amount. A fluctuation amount in a process result (film thickness, film quality, and the like) is determined in accordance with the above-described temperature changes on the wafer, changes in the process gas concentration, and changes in pressure. A process model is used to compute a performance fluctuation amount from a fluctuation amount for the process element. The process model used defines the effect of the process elements on a performance (the sensitivity). A performance fluctuation amount may be expressed as a sum of the fluctuation amount in a process element, and an effect on the performance (sensitivity). Expressed as a formula:

Performance Fluctuation Amount=Σ(Process-Element Fluctuation Amount×Process Model (Sensitivity))+Σ(Process Model (Interaction))

An interaction represents a fluctuation amount resulting from, for example, the influence of process elements on each other.

Next is described the estimation of a fluctuation amount for a performance indicator. A process result (each performance indicator value) is estimated on the basis of a fluctuation amount in a process element. The process model used is created separately by employing experimental design or past process results. Here, the fluctuation amount for the performance indicator is calculated from a base value of the performance indicator with the fluctuation amount in a process element parameter as the input.

An example is provided of an estimation formula used to create a performance estimation model. Specifically, provided is an example of an estimation formula for the deposition rate (D.R.) using a Partial least squares regression (PLS-R) method. The deposition rate (Fdr) can be expressed as a sum of products (linear combination) of approximation coefficients (a0, a1, a2, a3) for each process element, and a fluctuation amount computed from a base value for the process element parameters temperature (Temp), flow rate for gas A (GasA), flow rate for gas B (GasB), and pressure (Press). The interactions may be similarly expressed as a sum of products between the approximation coefficients, and interaction parameters (interaction0, interaction1, . . . ). An interaction parameter may be, for instance, Temp×GasA.

The sum of products Fdr(Temp, GasA, GasB, Press)=a0× Temp+a1×GasA+a2×GasB+a3×Press+b0×interaction0+b2× interaction1++approximation coefficients a0, a1, a2, a3, b0, b1, b2, . . . may be obtained from methods besides Partial least squares regression analysis, such as Principle components regression analysis (PCR), or Multiple regression analysis (MRA) methods.

The estimation formula is not limited to linear combinations, and a non-linear model may be used. Genetic algorithms (GA), and genetic programming (GP) are examples of the non-linear models that may be used. The formula presented below is used to obtain the refractive index (R.I.) using genetic programming. The formula is expressed below as a symbolic expression (S-expression) using the Lisp programming language. Atoms x1 through x7 are parameters, atoms m0 through m13 are approximation coefficients, and atoms c1 through c15 are constants. Further, funcx and funcy are preliminarily defined blocks of numerical formulas; for example, in addition to mathematical formulas such as trigonometric functions (sine, cosine, and tangent), the physical formulas for heat, liquid, electricity, plasma and the like may also be adopted.

Fri( )=(+(×m0(+(×(×(−(+(×m1 x7)c1)(+(×m2 x2)c2)) (funcx(+(×m3 x1)c3))) (+(×m4 x4)c4))(+(+(−(+ (×m5 x5)c5)(+(×m6 x2)c6))(−(funcy (+(×m7 x1) c7)) (+(×m8 x4)c8)))(+(×(+(×m9 x2)c9)(−c10(+(×m10 x3)c11)))(+(+(×m11 x6) c12)(−(+(×m12 x5)c13)(+(×m13 x4)c14)))))))
c15)−

A model may be generated which accepts parameter settings instead of the fluctuation amounts for the process element parameters computed from the base values to estimate performance indicator values. The performance indicator values may be a model representing intra-wafer and inter-wafer uniformity, a film composition ratio, the amount of impurities in the film, an index representing the amount of influence on a subsequent process such as an etching durability index, and the like.

An algorithm may determine a parameter correction amount that ensures the performance is within a target range; the algorithm is described next. Here, in order to simplify the description, the optimization of two target functions is described: a function Fdr( ) for a target deposition rate; and a function Fri( ) for a target refractive index. Note there may be three or more target functions. A variable x is taken as a collection of parameter correction amounts that take into account the resolving power of each of the process element parameters. The deposition target range, and the refractive index target range are DRrange, and RIrange respectively.

The following are the deposition target range, and the refractive index target range expressed as formulas.

$$f(x)=\min(Fdr(xdr),Fri(xri))$$

$$Fdr(xdr) \leq |DRrange|$$

$$Fri(xri) \leq |RIrange|$$

Figure 18:
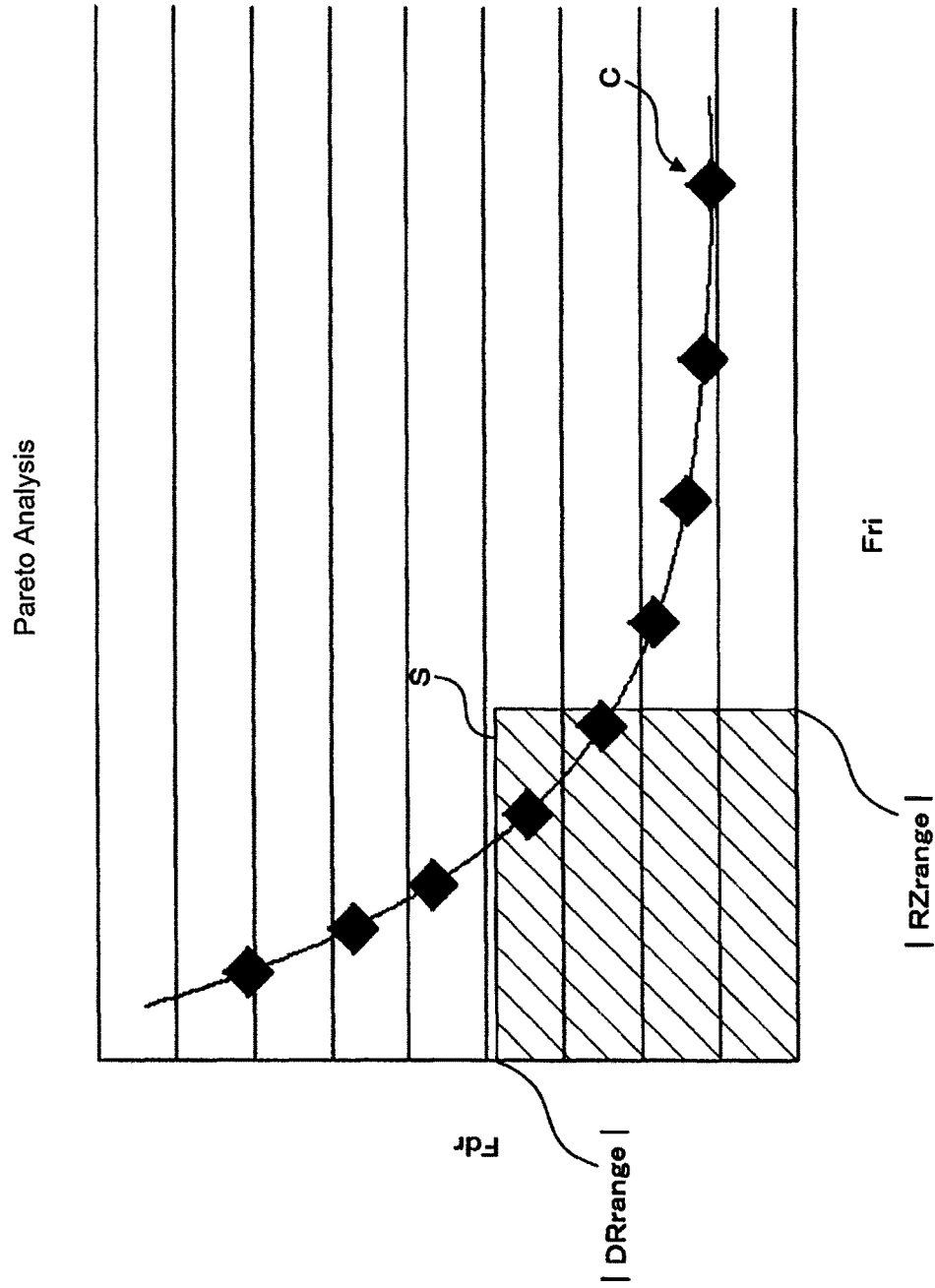
FIG. 18 illustrates a target space.

FIG. 18 illustrates a target space. When there are two target functions, the target space may be expressed in two dimensions as illustrated in FIG. 18. The curve c illustrated in FIG. 18 thus becomes the optimal solution set (Pareto solution), and illustrates the trade-off relationship between the functions Fdr( ), and Fri( ); that is, as one function improves, the other worsens. Points within a permissible range s for the functions Fdr( ) and Fri( ) represented by the above-described DRrange and RIrange allows a selectable solution set of parameter settings.

For instance, a quasi-Newton method, sequential quadratic programming, genetic algorithms (GA), genetic programming (GP), neural networks, and the like are examples of optimizations (multi-objective optimization) that may be used.

The two target functions Fdr( )and Fri( )use the fluctuation amounts for each of the process elements as arguments, and therefore the solution set is a collection of parameter correction amounts for each of the process elements. The computed parameter correction amounts may be transmitted to the process device 4 via the HSMS communication relay system 3.

Figure 19:
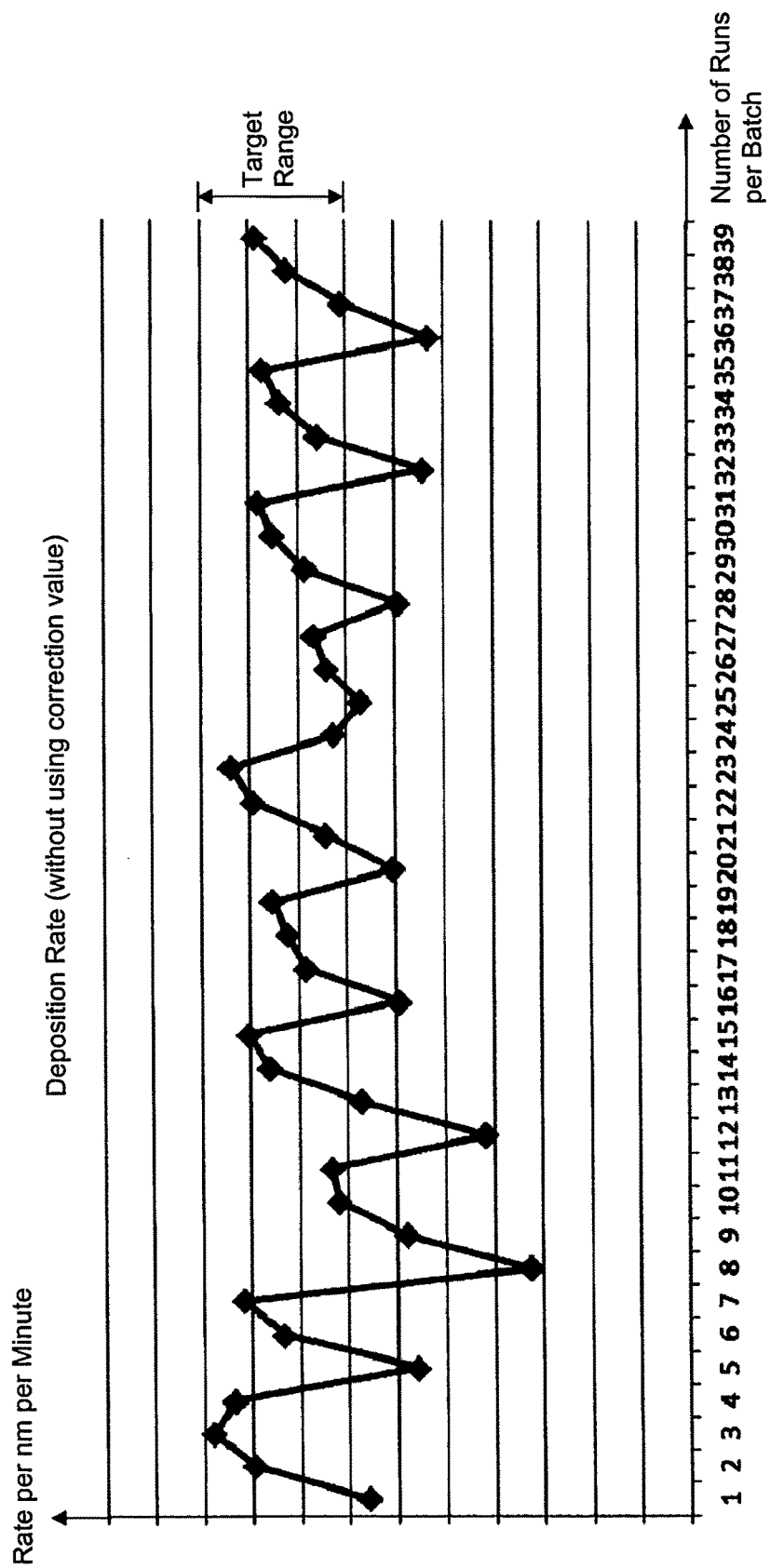
FIG. 19 is a graph illustrating the deposition rate when a correction value from the correction value computation device is not used.
Figure 20:
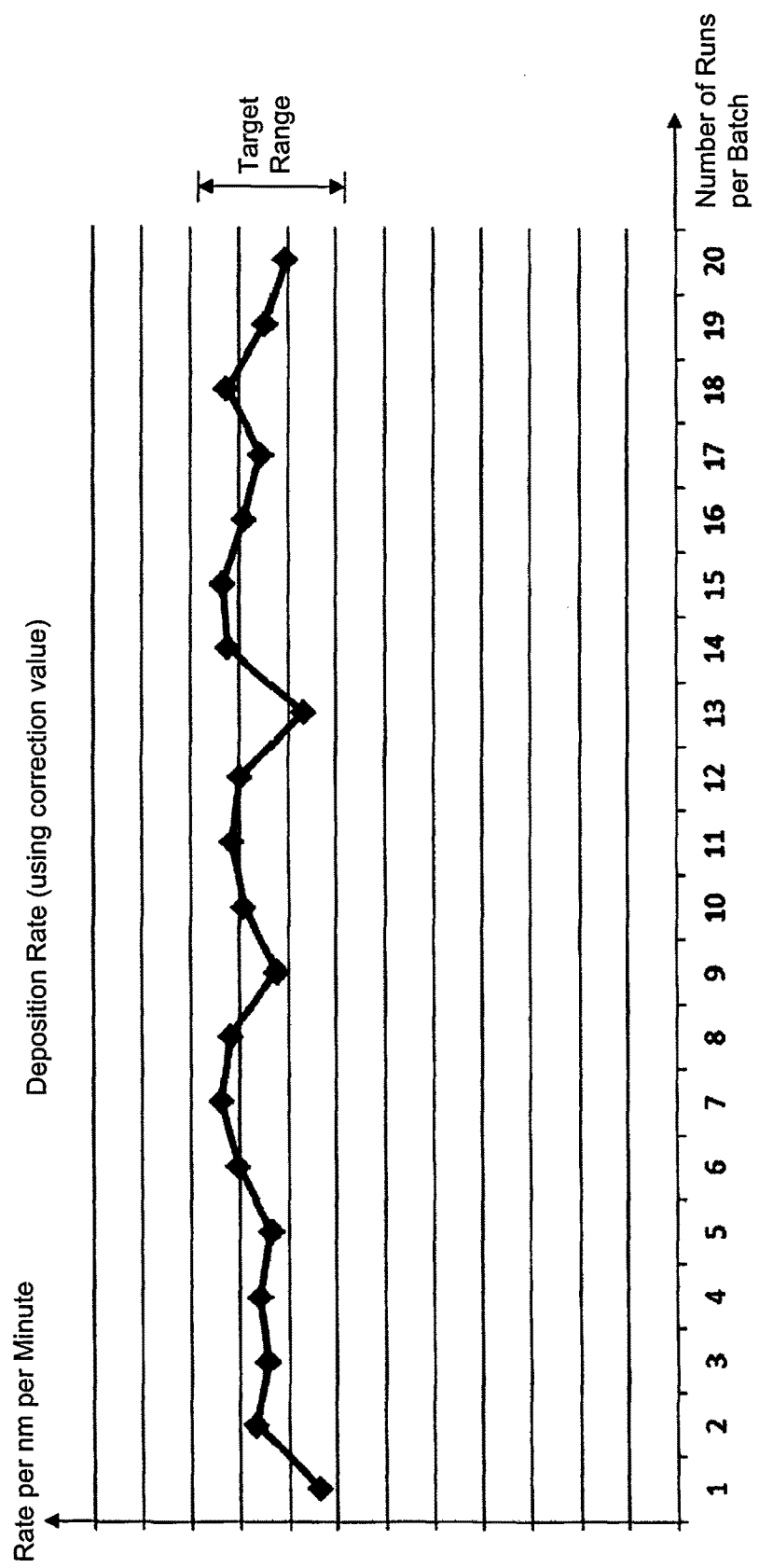
FIG. 20 is a graph illustrating the deposition rate when a correction value from the correction value computation device is used.

FIG. 19 is a graph illustrating the deposition rate when a correction value from the correction value computation device 1 is not used. The vertical axis represents the deposition rate in nanometers per minute (nm/min). The horizontal axis represents the number of runs. FIG. 20 is a graph illustrating the deposition rate when a correction value from the correction value computation device 1 is used. The vertical and horizontal axes are identical to those in FIG. 19. As can be understood from comparing FIG. 19 and FIG. 20, when the correction value from the correction value computation device 1 is used, the deposition rate stays within the target range.

Figure 21:
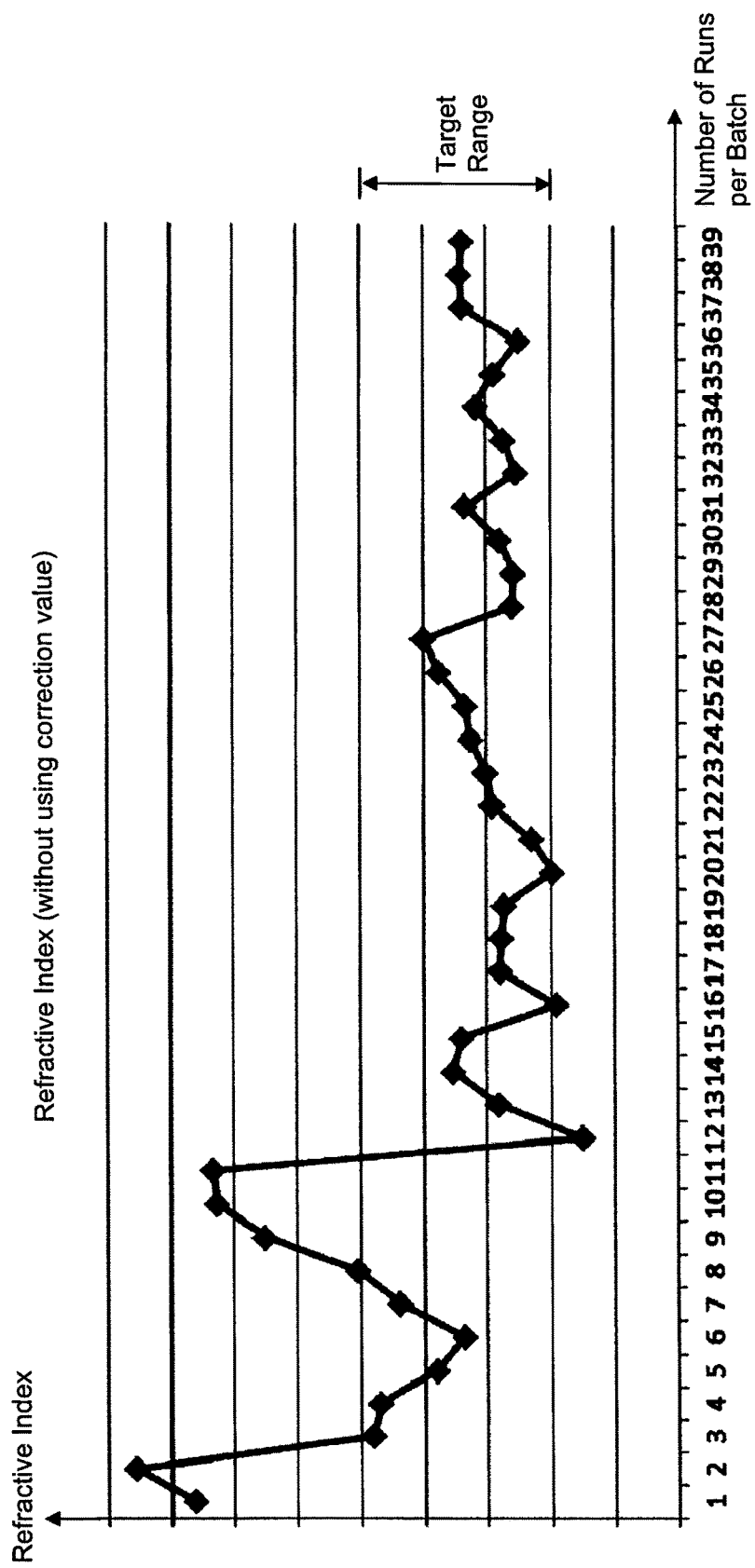
FIG. 21 is a graph illustrating a refractive index when a correction value from the correction value computation device is not used.
Figure 22:
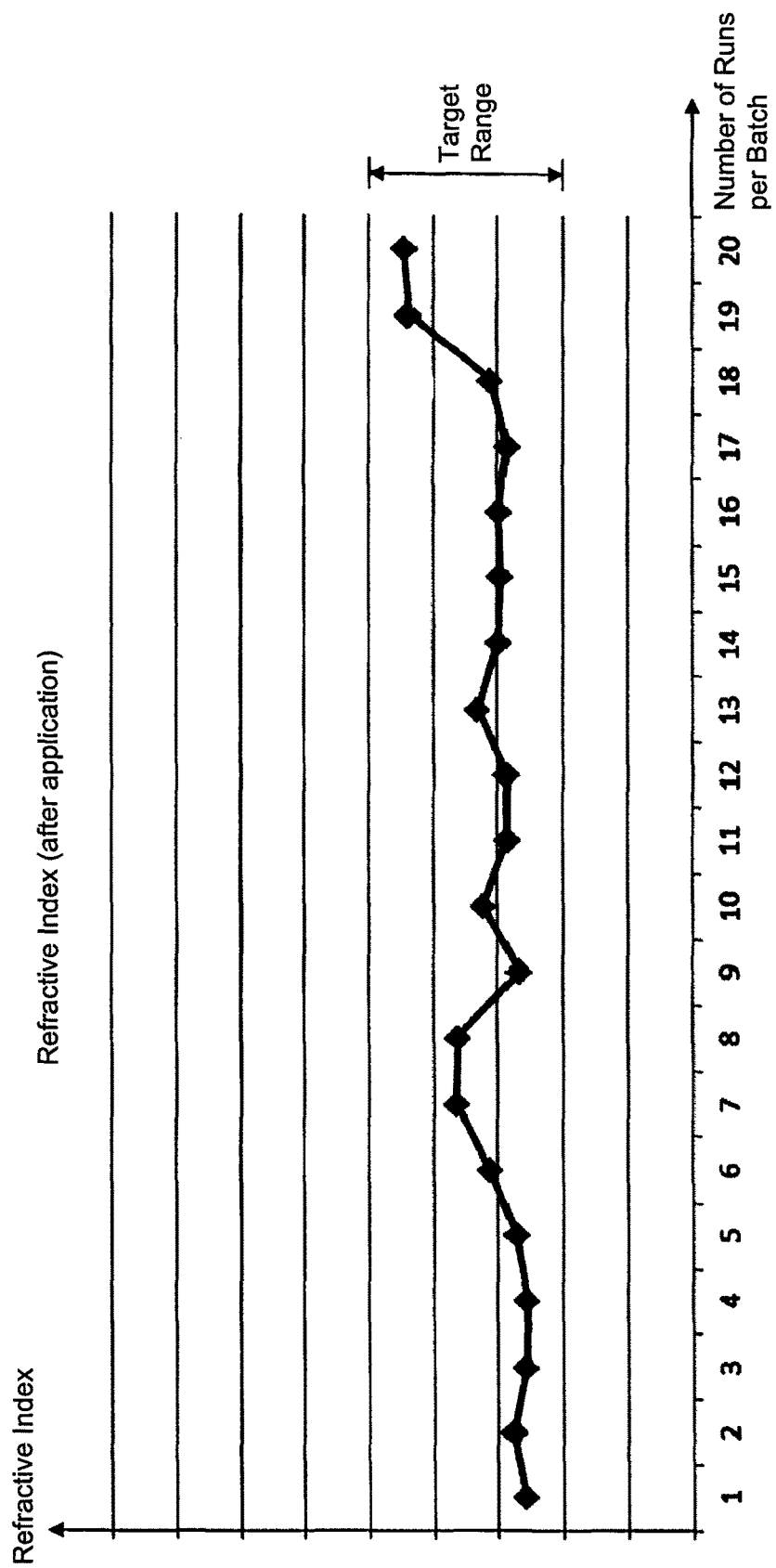
FIG. 22 is a graph illustrating a refractive index when a correction value from the correction value computation device is used.

FIG. 21 is a graph illustrating a refractive index when a correction value from the correction value computation device 1 is not used. The vertical axis represents the refractive index, and is non-dimensional. The horizontal axis represents the number of runs. FIG. 22 is a graph illustrating a refractive index when a correction value from the correction value computation device 1 is used. The vertical and horizontal axes are identical to those in FIG. 21. As can be understood from comparing FIG. 21 and FIG. 22, when the correction value from the correction value computation device 1 is used, the refractive index stays within the target range.

Figure 23:
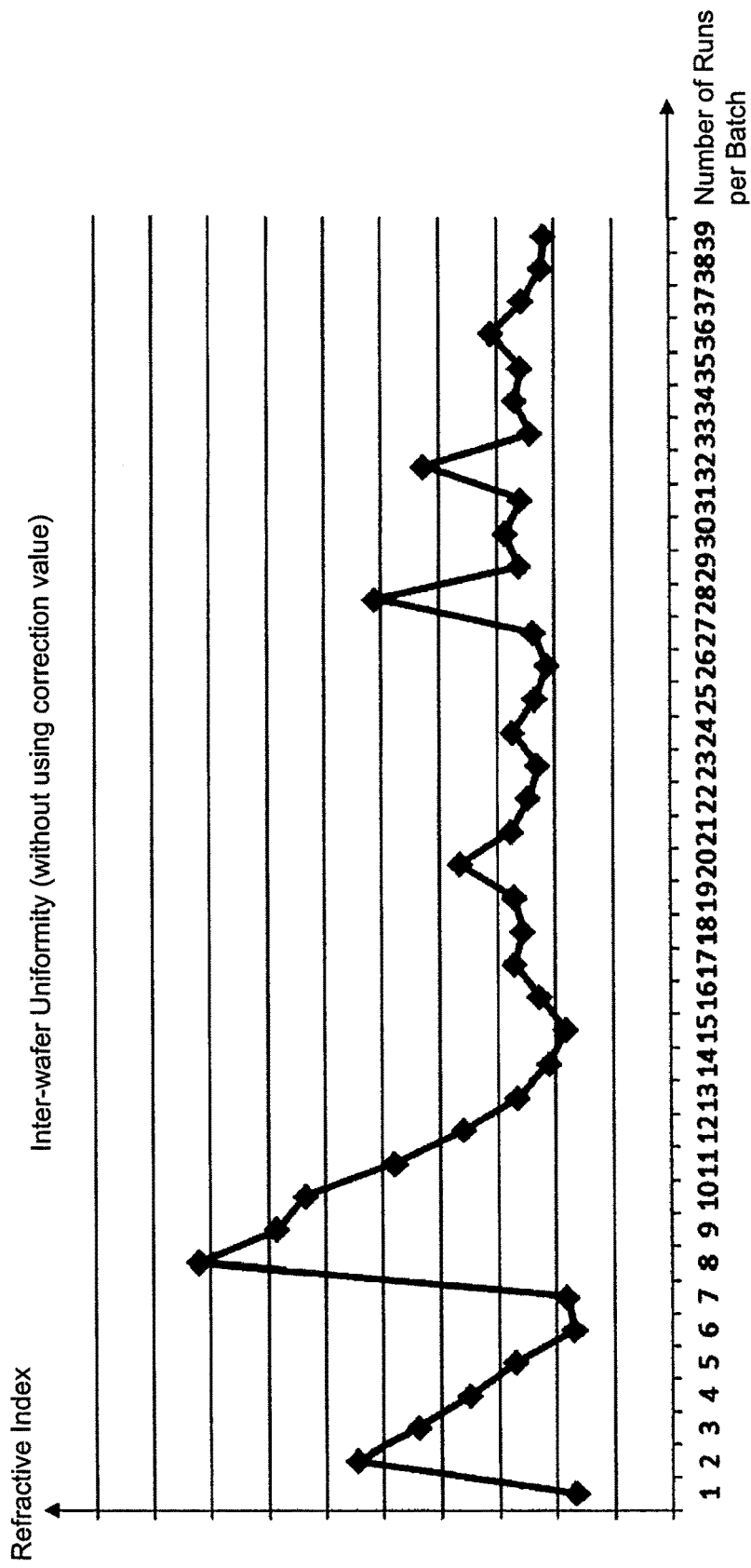
FIG. 23 is a graph illustrating an inter-wafer uniformity when a correction value from the correction value computation device is not used.
Figure 24:
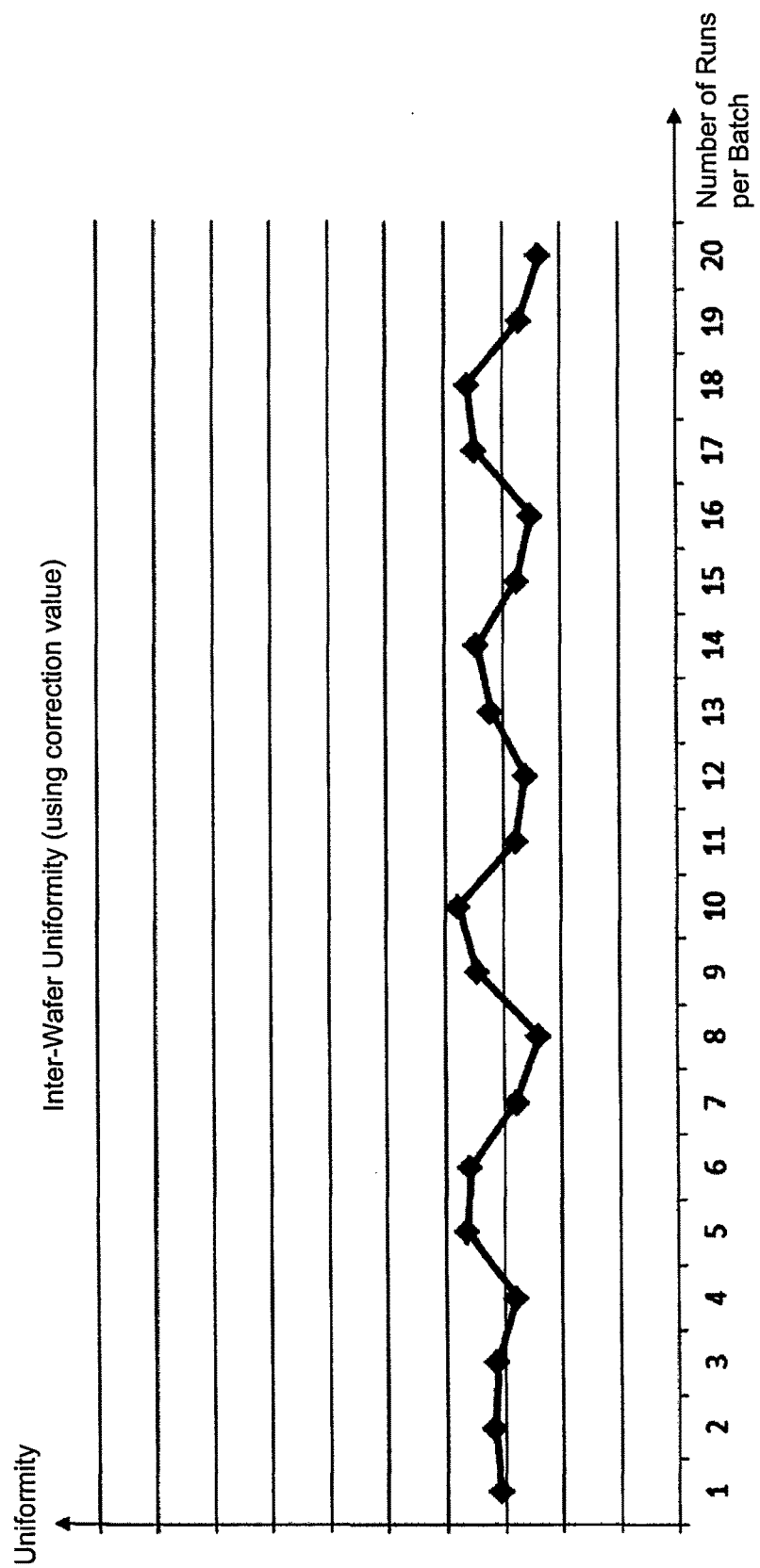
FIG. 24 is a graph illustrating an inter-wafer uniformity when a correction value from the correction value computation device is used.
Figure 25:
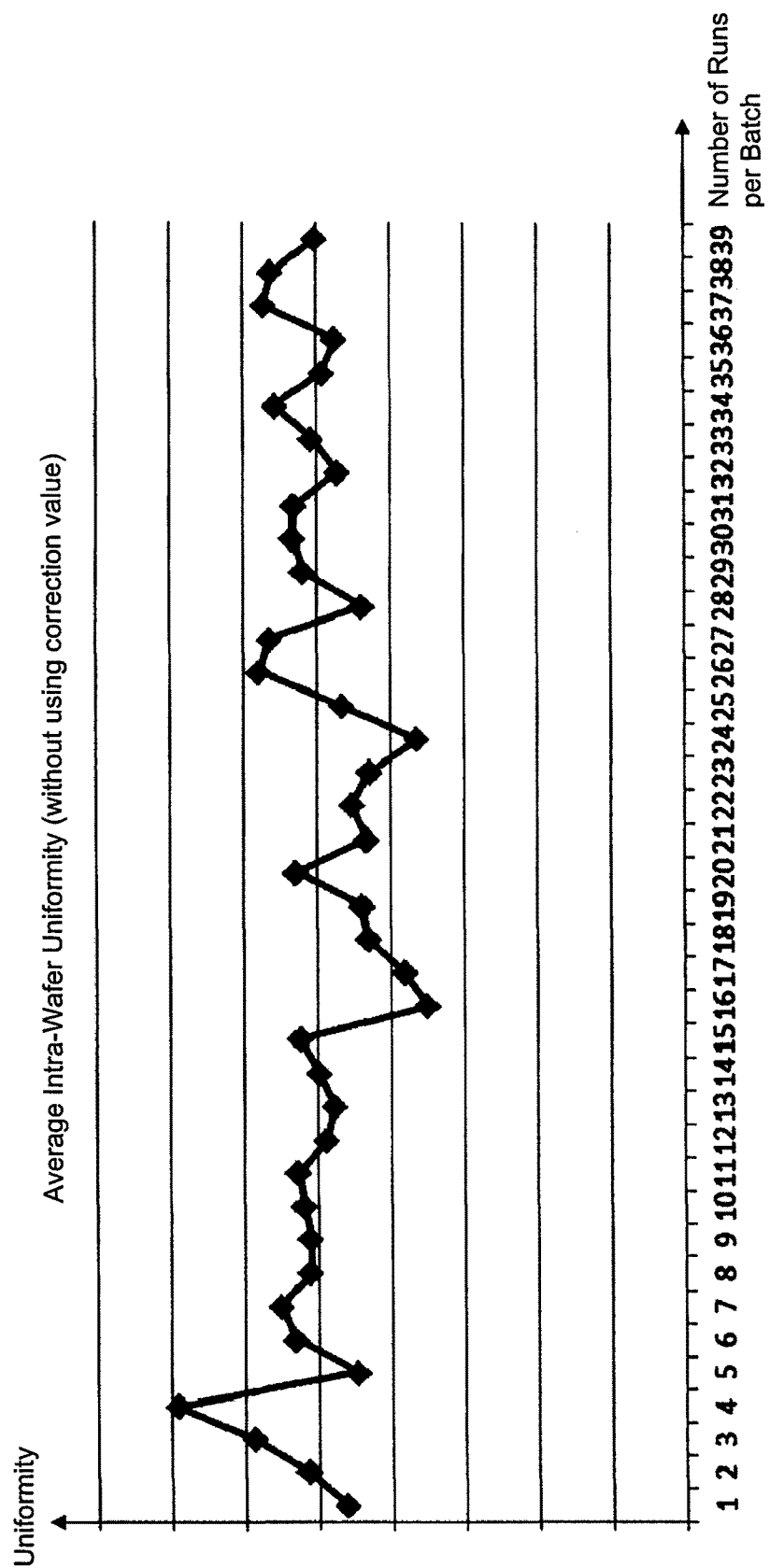
FIG. 25 is a graph illustrating an intra-wafer uniformity when a correction value from the correction value computation device is not used.
Figure 26:
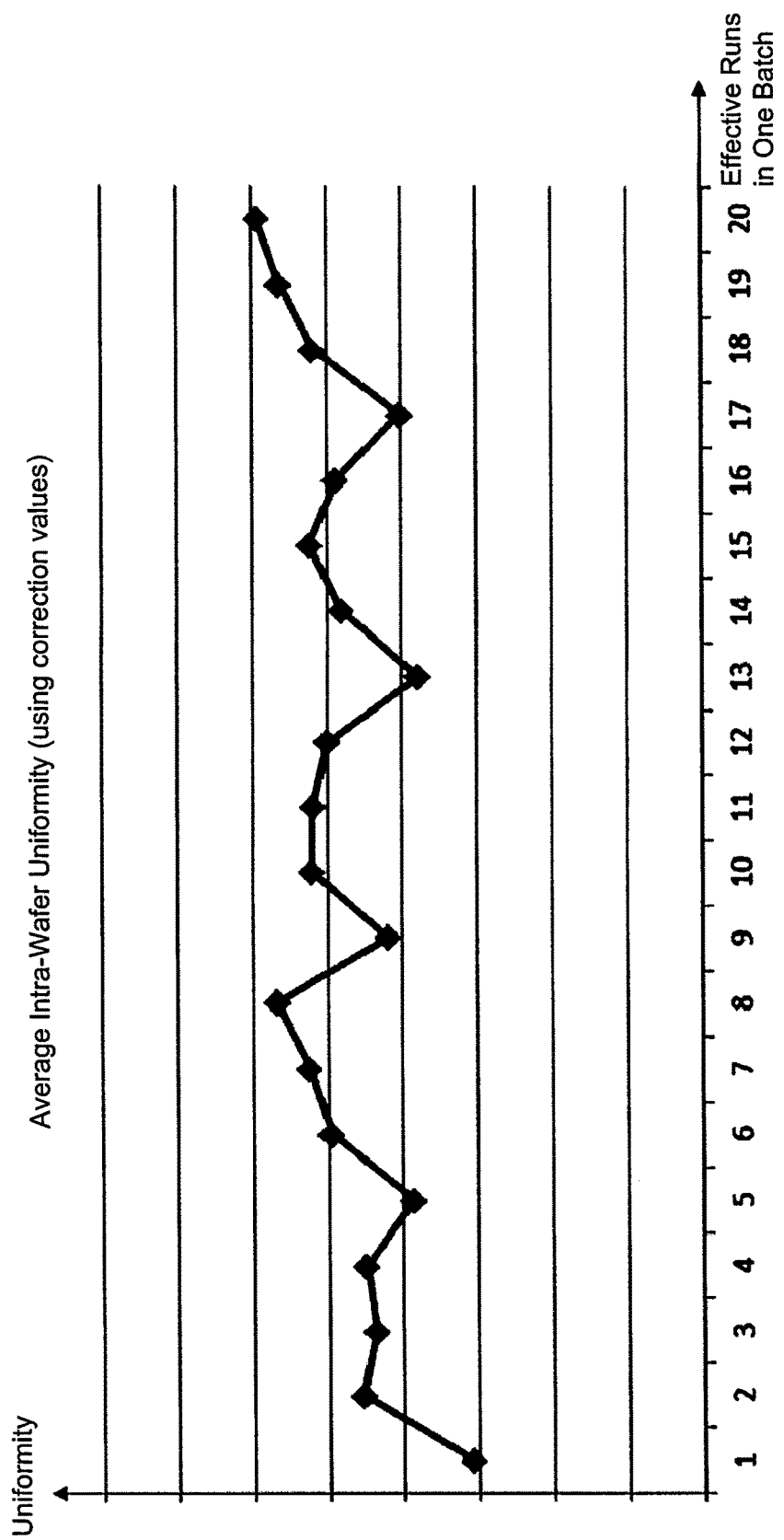
FIG. 26 is a graph illustrating an intra-wafer uniformity when a correction value from the correction value computation device is used.

FIG. 23 is a graph illustrating an inter-wafer uniformity when a correction value from the correction value computation device 1 is not used. FIG. 24 is a graph illustrating an inter-wafer uniformity when a correction value from the correction value computation device 1 is used. The vertical axes in FIG. 23 and FIG. 24 both represent the inter-wafer uniformity (i.e., the uniformity of an average film thickness among wafers). The horizontal axes represent the number of runs. FIG. 25 is a graph illustrating intra-wafer uniformity when a correction value from the correction value computation device 1 is not used. FIG. 26 is a graph illustrating intra-wafer uniformity when a correction value from the correction value computation device 1 is used. The vertical axes in FIG. 25 and FIG. 26 both represent intra-wafer uniformity. The horizontal axes represent the number of runs. As can be understood from examining FIG. 23 through FIG. 26, the quality of both the inter-wafer uniformity and the intra-wafer uniformity are maintained or improved, even on using the correction values from the correction value computation device 1. That is, clearly, as a secondary effect, the other performance indicators such as inter-wafer, and intra-wafer uniformity will not worsen, even on using a correction value from the correction value computation device 1 to control the process device 4 so that the deposition rate and refractive index fall within a target range.

When designing the above-described model, an operator may optimize the model while monitoring the values of the performance indicators. Thereafter, the correction value computation device 1 can use the optimized model to compute a correction value without any operator intervention.

The above explanation provides an example of the correction value computation device 1 transmitting a correction value to the process device 4, which is a deposition device. However, the parameters entered into the correction value computation device 1 may be for computing the correction values for other devices such as an etching device, a photo-resist device, a cleaning device, or the like.

The above-described model can represent another type of process device 4 such as an etching device, a photo-resist device, a cleaning device, or the like. The correction value computation device 1 may thereby compute the correction values used in another type of process device 4. For instance, the deterioration of the components inside a processing chamber, and of a sensor can be considered a fluctuation phenomenon in a plasma-etching device. The flow ratio of a process gas or an additive gas, the pressure inside the process chamber, the high-frequency power in an upper part, the high-frequency power in a lower part, the temperature of an upper electrode, and the temperature of a lower electrode, and the like can be considered the process elements in the system. Additionally, the line width (height, width, depth), and the inclination of the sidewalls can be considered the performance indicators in the system.

Embodiment 2

Figure 27:
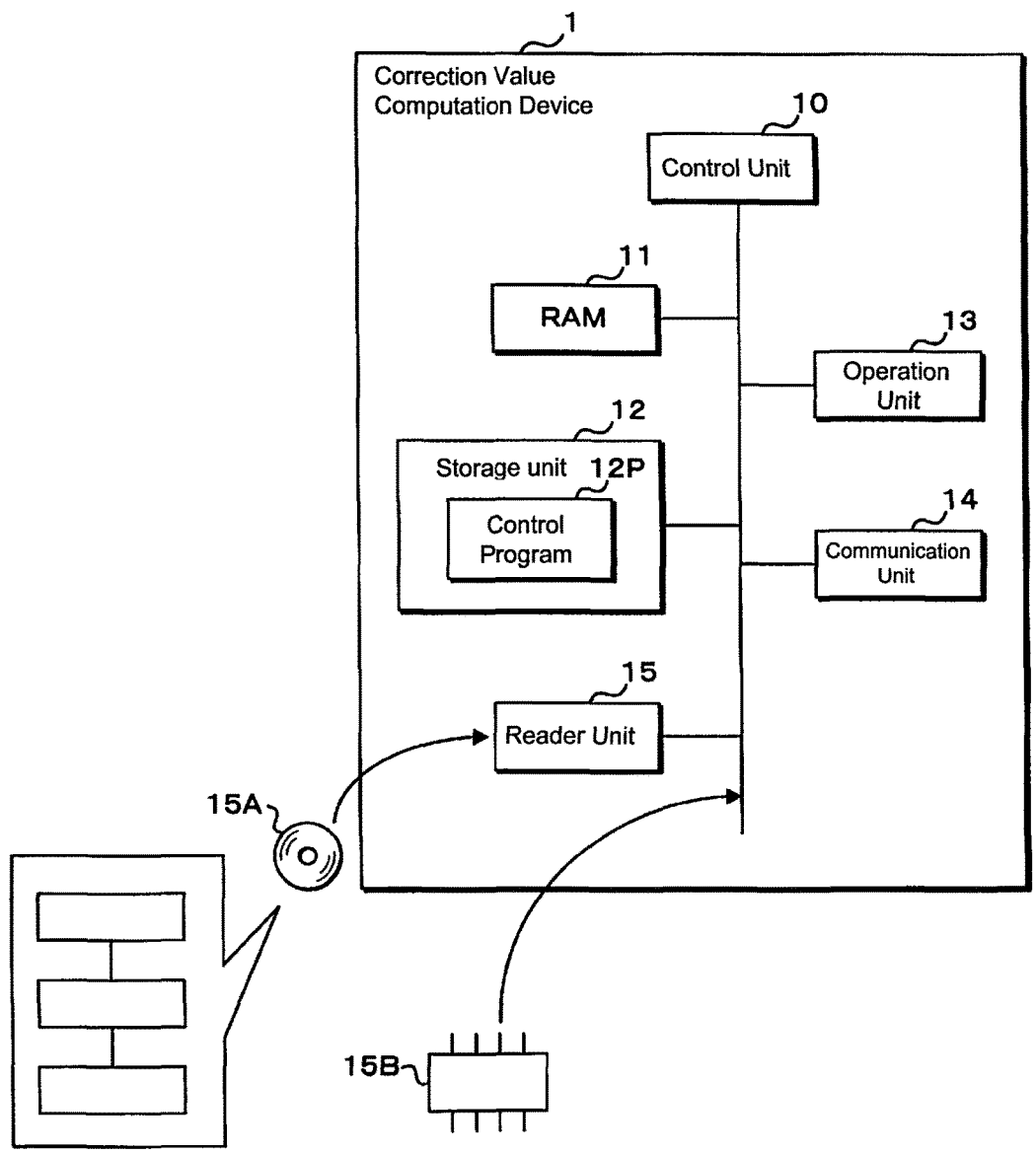
FIG. 27 is an example of a hardware configuration for a correction value computation device according to a second embodiment.

FIG. 27 is an example of a hardware configuration for a correction value computation device 1 according to a second embodiment. The correction value computation device 1 may be configured from a general-purpose computer such as a server computer, or a personal computer, or the like. The correction value computation device 1 also includes a control unit 10, random access memory (RAM) 11, a storage unit 12, and operation unit 13, a communication unit 14, and a reader unit 15.

The control program used to operate the correction value computation device 1 may be read from a portable storage medium (15A) such as a CD-ROM, Digital Versatile Disk (DVD), memory card, or Universal Serial Bus (USB) memory, or the like, and stored in the storage unit 12 by the reader unit 15. The aforementioned program may also be recorded into a semiconductor memory (15B) such as flash memory, which is then installed in the correction value computation device 1. Finally, the aforementioned program may also be downloaded from another server computer (not shown) connected to the correction value computation device 1 via a communication network such as the Internet.

An example of this case is described below.

The correction value computation device 1 illustrated in FIG. 27 reads a program that executes the various above-described software processes from the portable storage medium (15A) or a semiconductor memory (15B). Alternatively, the correction value computation device 1 downloads the program from another server computer (not shown) via a communication network. The aforementioned program is installed as the control program (12P), loaded into the RAM 11, and then executed therefrom. The program thereby functions as the above-described correction value computation device 1.

The second embodiment functions as above described. Otherwise the second embodiment is identical to the first embodiment, and thus corresponding components are given the same reference numbers, and the detailed descriptions thereof are omitted.

When producing a semiconductor integrated circuit, various processes are carried out on the semiconductor wafer which is created from a silicon substrate and the like, such as deposition, etching, oxidation, diffusion, reforming, and natural oxidation film removal. Various factors cause the state of the manufacturing apparatus carrying out these processes to fluctuate such as chronological change, variation, and deviation. As a result, fluctuations in the state reduce process repeatability, which brings about fluctuations in the performance of an individual manufacturing apparatus. These fluctuations in the performance also affect the quality of a subsequent process or product (final product).

The process parameters for the manufacturing apparatus can be adjusted while controlling the manufacturing apparatus to ensure that the performance indicators for a process (e.g., actual measurement values of process results measured by an external measurement device) fall within a standard range. The effect of the process elements on a performance (the sensitivity) may be a parameter used for an adjustment, and an easily controllable parameter is selected.

However, conventional techniques have the following problems. An adjustment parameter is selected with the goal of bringing a monitored performance indicator into the standard range, and the factors that are the basis for the performance fluctuation are not removed. That is, the adjustment parameter is used to adjust the fluctuation in a performance indicator generated because of fluctuations in the device state, not to adjust the fluctuations in the device state. Therefore, the adjustment produces unintended fluctuations as a result of correcting a process parameter different from the process parameter causing the fluctuations, or unintended fluctuations in the process results (another performance indicator, or in product quality). For instance, the film composition ratio, and the film density may fluctuate even though the film thickness is within a standard range during a deposition process. Those fluctuations lead to fluctuations in the etching rate and the etching size in the next stage of production.

Despite that, the manufacturing process is requiring further miniaturization of interconnect widths and interconnect separation widths with the increasing integration density of semiconductor integrated circuits. Consequently, given that the further miniaturization also narrows a standard range for a product, simply using a sizing standard as a control indicator in each process makes it increasingly difficult to maintain product quality. Moreover, the accuracy of an estimation model created using statistical or numerical methods tends to decrease with a small sample size, and thus building the model itself may become difficult.

A correction value computation device, a correction value computation method, and a computer program according to one aspect of the present invention use a model representing a relationship between fluctuations in a manufacturing apparatus and a process element, and a model representing a relationship between a process element and a performance indicator to compute a correction value for a control parameter that takes into account fluctuations in the state of the manufacturing apparatus.

A correction value computation device according to an embodiment of the present invention computes a correction value for a control parameter provided to a manufacturing apparatus that executes a manufacturing process in accordance with the control parameter. The correction value computation device includes: an index value acquisition unit for acquiring an index value representing a fluctuation phenomenon in the manufacturing apparatus; a model acquisition unit for acquiring a device model representing a relationship between an index value indicative of a fluctuation phenomenon in the manufacturing apparatus and a process element indicative of an environment in which the manufacturing process is executed, and a process model representing a relationship between a performance indicator rating results of executing the manufacturing process and a process element; a sensor value acquisition unit for acquiring an output value output from a sensor arranged in the manufacturing apparatus; a first conversion unit for transforming an acquired sensor output value into a fluctuation amount for a process element; a second conversion unit using the device model to transform the acquired index value into a fluctuation amount for a process element; a fluctuation amount computation unit using the process model to compute a fluctuation amount for a performance indicator from the fluctuation amounts in the process element obtained by the first conversion unit and the second conversion unit; a correction amount computation unit for computing a correction amount for the performance indicator from a control range for the performance indicator and a fluctuation amount that was computed for the performance indicator; and a correction value computation unit for using a process model to convert the correction amount for the performance indicator that was computed into a correction amount for each process element, and computing a correction value for a control parameter in a process executed on the manufacturing apparatus from the converted correction amount.

The correction value computation device: acquires a fluctuation amount in a process element that takes a fluctuation phenomenon in a manufacturing apparatus into account; converts the acquired fluctuation amount in the process element into a fluctuation amount in a performance indicator; uses the converted fluctuation amount for a performance indicator and a control range for the performance indicator to acquire a fluctuation amount in the performance indicator; converts the acquire fluctuation amount in the performance indicator into a fluctuation amount for each process element; and finally uses the converted fluctuation amount for each process element to compute a correction value that is applied to a control parameter. Therefore, even if a fluctuation phenomenon arises in the manufacturing apparatus, the correction value computation device can compute a correction value that retains the repeatability of the process.

The correction value computation device according to an embodiment of the present invention has configuration such that there are multiple aforementioned performance indicators. Further, the fluctuation amount computation unit has configuration which converts a fluctuation amount in the performance indicators for each one of the performance indicators. The correction value computation unit uses multi-objective optimization to acquire a correction amount for each of the performance indicators.

The correction value computation device according to an embodiment of the present invention may have configuration such that the correction amounts for the performance indicators are acquired as a Pareto optimal solution.

The correction amounts for the performance indicators are acquired so that the performance indicators fall within a control range (within a standard range). Therefore, on making the correction, no performance indicators lie outside the control range (outside the standard range), allowing for stable control.

The correction value computation device according to another embodiment of the present invention may have configuration such that the process model includes a model that expresses the relationship between the performance indicators and the process element as a numerical formula.

Because the relationship between the performance indicators and the process element is expressed as a numerical formula, a performance indicator can be computed from a process element.

For a manufacturing apparatus that is a semiconductor manufacturing apparatus, the correction value computation device according to another embodiment of the present invention has configuration which includes at least one of a temperature, a gas flow rate, a pressure, and a process time as a process element, and includes at least one of a deposition rate, a refraction index, an inter-wafer uniformity, and an intra-wafer uniformity as the performance indicator.

The correction value computation device thereby maintains the process repeatability in the semiconductor manufacturing apparatus.

A correction value computation method according to an embodiment of the present invention computes a correction value for a control parameter provided to a manufacturing apparatus that executes a manufacturing process in accordance with the control parameter. The correction value computation method includes: acquiring a device model representing a relationship between an index value indicative of a fluctuation phenomenon in the manufacturing apparatus, and a fluctuation amount in a process element indicative of an environment in which the manufacturing process is executed, and a process model representing a relationship between a performance indicator rating results of executing the manufacturing process and the process element; acquiring an output value output from a sensor arranged in the manufacturing apparatus; transforming an acquired sensor output value into a first fluctuation amount for a process element; acquiring an index value indicative of a fluctuation phenomenon in the manufacturing apparatus; using the device model to transform the acquired index value into a second fluctuation amount for a process element; using the process model to compute a fluctuation amount for the performance indicator from the first and second fluctuation amounts for a process element; computing a correction amount for the performance indicator from a control range for the performance indicator and the fluctuation amount computed for the performance indicator; using the process model to convert the correction amount acquired for the performance indicator into a correction amount for each process element, and computing a correction value for a control parameter from the converted correction amount.

A computer program according to an embodiment of the present invention computes a correction value for a control parameter provided to a manufacturing apparatus that executes a manufacturing process in accordance with the control parameter. The computation program carries out the steps of: acquiring a device model representing a relationship between an index value indicative of a fluctuation phenomenon in the manufacturing apparatus, and a fluctuation amount in a process element indicative of an environment in which the manufacturing process is executed, and a process model representing a relationship between a performance indicator rating results of executing the manufacturing process and the process element; acquiring an output value output from a sensor arranged in the manufacturing apparatus; transforming an acquired sensor output value into a first fluctuation amount for a process element; acquiring an index value indicative of a fluctuation phenomenon in the manufacturing apparatus; using the device model to transform the acquired index value into a second fluctuation amount for a process element; using the process model to compute a fluctuation amount for the performance indicator from the first and second fluctuation amounts for a process element; computing a correction amount for the performance indicator from a control range for the performance indicator and the fluctuation amount computed for the performance indicator; using the process model to convert the correction amount computed for the performance indicator into a correction amount for each process element, and computing a correction value for a control parameter from the converted correction amount.

The correction amounts for the performance indicators are acquired so that the performance indicators fall within a control range (within a standard range). Therefore, no performance indicators lie outside the control range (outside the standard range). Accordingly, correction values for correcting the control parameters may be acquired so that the manufacturing apparatus may carryout stable operations.

The correction value computation device according to an embodiment of the present invention acquires a correction value for a control parameter that takes into account the fluctuation phenomenon in a manufacturing apparatus. Therefore, a manufacturing process may be executed in accordance with the state of the manufacturing apparatus, and a correction value may be acquired for a control parameter used to maintain the repeatability of the process.

Obviously, numerous modifications and variations of the present invention are possible in light of the above teachings. It is therefore to be understood that within the scope of the appended claims, the invention may be practiced otherwise than as specifically described herein.

What is claimed is:

1. A correction value computation device for computing a correction value for a control parameter in a manufacturing process executed on a manufacturing apparatus, comprising:
  circuitry configured to
    acquire an index value representing a fluctuation phenomenon in a manufacturing apparatus;
    acquire an apparatus model representing a relationship between the index value and a process element of an environment in which a manufacturing process is executed;
    acquire a process model representing a relationship between a performance indicator rating results of executing the manufacturing process and the process element;
    acquire an output value output from a sensor provided in the manufacturing apparatus;

transform the output value into a first fluctuation amount for the process element;

transform the index value into a second fluctuation amount for the process element based on the apparatus model;

compute a fluctuation amount for the performance indicator from the first and second fluctuation amounts for the process element based on the process model;

compute a correction amount for the performance indicator from a control range for the performance indicator and the fluctuation amount for the performance indicator; and convert the correction amount for the performance indicator into a correction amount for each process element based on the process model such that a correction value for a control parameter in a process executed on the manufacturing apparatus is computed from the correction amount converted for each process element.

2. A correction value computation device according to claim 1, wherein the circuitry is configured to compute the fluctuation amount for the performance indicator from a plurality of performance indicators, and compute the correction amount for each of the performance indicators based on a multi-objective optimization method.

3. A correction value computation device according to claim 2, wherein the circuitry is configured to compute the correction amount for each of the performance indicators as a Pareto optimal solution.

4. A correction value computation device according to claim 3, wherein the process model includes a model representing the relationship between the performance indicator and the process element in a mathematical equation.

5. A correction value computation device according to claim 3, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

6. A correction value computation device according to claim 2, wherein the process model includes a model representing the relationship between the performance indicator and the process element in a mathematical equation.

7. A correction value computation device according to claim 2, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

8. A correction value computation device according to claim 1, wherein the process model includes a model representing the relationship between the performance indicator and the process element in a mathematical equation.

9. A correction value computation device according to claim 1, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

10. A correction value computation device according to claim 8, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

11. A method for computing a correction value for a control parameter in a manufacturing process executed on a manufacturing apparatus, comprising:

acquiring an apparatus model representing a relationship between an index value of a fluctuation phenomenon in a manufacturing apparatus and a fluctuation amount in a process element of an environment in which a manufacturing process is executed;

acquiring a process model representing a relationship between a performance indicator rating results of executing the manufacturing process and the process element;

acquiring an output value output from a sensor provided in the manufacturing apparatus;

transforming the output value acquired from the sensor into a first fluctuation amount for the process element;

acquiring the index value of the fluctuation phenomenon in the manufacturing apparatus;

transforming the index value into a second fluctuation amount for the process element based on the apparatus model;

computing a fluctuation amount for the performance indicator from the first and second fluctuation amounts for the process element based on the process model;

computing a correction amount for the performance indicator from a control range for the performance indicator and the fluctuation amount computed for the performance indicator; and converting the correction amount computed for the performance indicator into a correction amount for each process element based on the process model such that a correction value for a control parameter in the manufacturing process executed on the manufacturing apparatus is computed from the correction amount converted for each process element.

12. A method for computing a correction value according to claim 11, wherein the computing of the fluctuation amount for the performance indicator comprises computing the fluctuation amount for the performance indicator from a plurality of performance indicators, and the computing of the correction amount comprises computing the correction amount for each of the performance indicators based on a multi-objective optimization method.

13. A method for computing a correction value according to claim 12, wherein the computing of the correction amount comprises computing the correction amount for each of the performance indicators as a Pareto optimal solution.

14. A method for computing a correction value according to claim 13, wherein the process model includes a model representing the relationship between the performance indicator and the process element in a mathematical equation.

15. A method for computing a correction value according to claim 13, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

16. A method for computing a correction value according to claim 12, wherein the process model includes a model representing the relationship between the performance indicator and the process element in a mathematical equation.

17. A method for computing a correction value according to claim 12, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

18. A method for computing a correction value according to claim 11, wherein the process model includes a model representing the relationship between the performance indicator and the process element in a mathematical equation.

19. A method for computing a correction value according to claim 11, wherein the manufacturing apparatus is a semiconductor manufacturing apparatus, the process element includes at least one of temperature, gas flow rate, pressure and process time, and the performance indicator includes at least one of deposition rate, refractive index, inter-wafer uniformity and intra-wafer uniformity.

20. A non-transitory computer readable medium stored thereon a program that when executed by a computer causes the computer having circuitry to execute a method for computing a correction value for a control parameter in a manufacturing process executed on a manufacturing apparatus, the method comprising:

acquiring an apparatus model representing a relationship between an index value of a fluctuation phenomenon in a manufacturing apparatus and a fluctuation amount in a process element of an environment in which a manufacturing process is executed;

acquiring a process model representing a relationship between a performance indicator rating results of executing the manufacturing process and the process element;

acquiring an output value output from a sensor provided in the manufacturing apparatus;

transforming the output value acquired from the sensor into a first fluctuation amount for the process element;

acquiring the index value of the fluctuation phenomenon in the manufacturing apparatus;

transforming the index value into a second fluctuation amount for the process element based on the apparatus model;

computing a fluctuation amount for the performance indicator from the first and second fluctuation amounts for the process element based on the process model;

computing a correction amount for the performance indicator from a control range for the performance indicator and the fluctuation amount computed for the performance indicator; and converting the correction amount computed for the performance indicator into a correction amount for each process element based on the process model such that a correction value for a control parameter in the manufacturing process executed on the manufacturing apparatus is computed from the correction amount converted for each process element.

\* \* \* \* \*